US008553026B2

(12) United States Patent
Park

(10) Patent No.: US 8,553,026 B2
(45) Date of Patent: Oct. 8, 2013

(54) SCAN DRIVER AND DRIVING METHOD THEREOF

(75) Inventor: Seong-Il Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 13/309,533

(22) Filed: Dec. 1, 2011

(65) Prior Publication Data
US 2012/0182283 A1 Jul. 19, 2012

(30) Foreign Application Priority Data

Jan. 14, 2011 (KR) .......................... 10-2011-0004076

(51) Int. Cl.
G06F 3/038 (2013.01)
G09G 5/00 (2006.01)

(52) U.S. Cl.
USPC .................. 345/212; 377/64; 377/75; 377/80

(58) Field of Classification Search
USPC ........... 345/76–100, 204, 208, 209, 211–212, 345/690; 377/64–81
See application file for complete search history.

(56) References Cited

U.S. PATENT DOCUMENTS

| 7,319,453 | B2 * | 1/2008 | Nojiri et al. ..................... 345/100 |
| 7,786,972 | B2 * | 8/2010 | Jeong et al. ..................... 345/100 |
| 2005/0179677 | A1 * | 8/2005 | Nojiri et al. ..................... 345/204 |
| 2007/0229409 | A1 * | 10/2007 | Shin .................................. 345/76 |
| 2008/0062071 | A1 * | 3/2008 | Jeong ............................... 345/46 |
| 2008/0074359 | A1 * | 3/2008 | Chung .............................. 345/76 |
| 2008/0158126 | A1 * | 7/2008 | Tung et al. ........................ 345/92 |
| 2010/0295837 | A1 * | 11/2010 | Yoshinaga et al. ............. 345/211 |

FOREIGN PATENT DOCUMENTS

| KR | 10-2006-0076147 A | 7/2006 |
| KR | 10-2010-0021130 A | 2/2010 |

* cited by examiner

Primary Examiner — William Boddie
Assistant Examiner — Amy C Onyekaba
(74) Attorney, Agent, or Firm — Christie, Parker & Hale, LLP

(57) ABSTRACT

A display device includes a plurality of scan lines and a scan driver. The scan driver includes a plurality of stages for transmitting a scan signal having a first voltage to the plurality of scan lines, and each of the stages includes a sequential switching unit, a sequential output unit, a concurrent switching unit, and a concurrent output unit. The concurrent output unit includes a first transistor for transmitting a second control signal to the output terminal according to a first control signal during a concurrent driving period before the scan signal is converted from a first level to a second level according to the second control signal, and a gate voltage of the first transistor is controlled by a voltage that is different from the first voltage according to the first control signal.

31 Claims, 17 Drawing Sheets

SCAN DRIVER AND DRIVING METHOD THEREOF

CROSS-REFERENCE TO RELATED APPLICATION

This application claims priority to and the benefit of Korean Patent Application No. 10-2011-0004076, filed in the Korean Intellectual Property Office on Jan. 14, 2011, the entire contents of which are incorporated herein by reference.

BACKGROUND

1. Field

The present invention relates to a scan driver and a driving method thereof. More particularly, the present invention relates to a scan driver of a display device.

2. Description of the Related Art

An active display device, such as an organic light emitting diode (OLED) display and a liquid crystal display (LCD), includes a plurality of pixels disposed in a matrix format, defined by a plurality of scan lines extending in a row direction and a plurality of data lines extending in a column direction. A scan driver sequentially applies scan pulses to the plurality of scan lines, and a data driver transmits data signals to the plurality of data lines to write corresponding data to the plurality of pixels for displaying images.

In general, the display device sequentially applies the scan pulses to the plurality of scan lines to sequentially write the data to the pixels included in the pixel lines extending in the row direction to display the images. However, as the size of the display panel of the display device is increased and the driving method becomes complicated, the display device concurrently (e.g., simultaneously) applies a voltage (e.g., a predetermined voltage) to the plurality of scan lines such that all pixels may be concurrently (e.g., simultaneously) initialized or concurrently (e.g., simultaneously) light-emitted or stopped from light emitting, as well as have sequential data writing.

Accordingly, a scan driver capable of executing an operation of a shift register for sequentially applying the scan pulses (hereinafter, sequential switching) and an operation of concurrently (e.g., simultaneously) outputting a voltage (e.g., a predetermined voltage) for turning on/off (hereinafter, concurrent switching) is desired. Particularly, research on a circuit structure that quickly and stably processes conversion between voltages when executing concurrent switching of the scan driver by converting into a high voltage (e.g., a predetermined high voltage) and a low voltage (e.g., a predetermined low voltage) and outputting them is desired.

The above information disclosed in this Background section is only for enhancement of understanding of the background of the invention, and therefore it may contain information that does not form the prior art that is already known in this country to a person of ordinary skill in the art.

SUMMARY

Embodiments of the present invention are directed toward a scan driver that is capable of concurrently (e.g., simultaneously) applying a voltage (e.g., a predetermined voltage), as well as having a function of a shift register for sequentially applying scan pulses and quickly and stably processing conversion between the voltages when concurrently (e.g., simultaneously) outputting a predetermined voltage.

According to an embodiment of the present invention, a scan driver includes a plurality of stages being configured to transmit a scan signal to a plurality of scan lines of a display device. Each of the stages includes a sequential switching unit, a sequential output unit, a concurrent switching unit, and a concurrent output unit. The sequential switching unit is configured to receive the scan signal from an output terminal of a previous stage. The sequential output unit is connected to an output terminal of a same stage of the stages. The concurrent output unit is connected to the output terminal. The sequential switching units of the stages are configured to sequentially scan the scan signal having a first voltage in a first period, and the sequential output units of the stages are configured to sequentially output the scan signal having the first voltage. The concurrent switching units of the stages are configured to concurrently output the scan signal having a same voltage in a second period, and the concurrent output units of the stages are configured to concurrently output the scan signal having the same voltage. The concurrent output unit includes a first transistor for transmitting a second control signal to the output terminal according to a first control signal during the second period, and a gate voltage of the first transistor is controlled by a second voltage that is different from the first voltage according to the first control signal before the scan signal is changed from a first level to a second level according to the second control signal.

The concurrent output unit may further include a second transistor connected to a gate of the first transistor, and the concurrent output unit may be configured to be turned on according to the first control signal to transmit a voltage of the second level.

The first transistor may be configured to output a same voltage as the first level or the second level as the scan signal during the second period corresponding to the second control signal when the first transistor is turned on.

The second voltage may be different from the voltage of the second level by a voltage difference of a third voltage.

The third voltage may be a threshold voltage of a second transistor included in the concurrent output unit of the scan driver.

When each of the stages includes PMOS transistors, the voltage of the second level may be a low level voltage and the second voltage may be higher than the low level voltage by the third voltage, and when each of the stages includes NMOS transistors, the voltage of the second level may be a high level voltage and the second voltage may be lower than the high level voltage by the third voltage.

The first control signal may have a gate-off voltage level for turning off transistors included in each of the stages at the first period and a gate-on voltage level for turning on the transistors included in each of the stages at a second period, and the second control signal may have a voltage of the first level or the second level at the second period.

The second period may include a third period and a fourth period, and the concurrent switching unit and the concurrent output unit included in each of the stages may be configured to concurrently output the scan signal of the same voltage as the first level corresponding to the second control signal of the first level during the third period, and to concurrently output the scan signal of the same voltage as the second level corresponding to the second control signal of the second level during the fourth period.

Each of the stages may include first, second, and third clock terminals, and first, second, and third clock signals may be alternately and respectively input to the first, second, and third clock terminals of each of the stages. The first, second, and third clock signals may sequentially have gate-on voltage levels for turning on the transistors included in each of the stages during the first period, and each have a cycle of 3 horizontal cycles and a 1/3 duty ratio.

The sequential switching unit and the sequential output unit of each of the stages may be configured to sequentially scan the scan signal corresponding to the first, second, and third clock signals during the first period, and the sequential output unit may be configured to output a voltage of the second clock terminal as the first voltage of the scan signal during the first period.

Each of the stages may further include a control terminal. A third control signal may be input to the control terminal, and the third control signal may have a gate-on voltage level for turning on the transistors included in each of the stages during the first period.

Each of the stages may include first, second, and third clock terminals. First, second, and third clock signals may be alternately and respectively input to the first, second, and third clock terminals of each of the stages, and the first, second, and third clock signals all may have the gate-off voltage level for turning off the transistors included in each of the stages during the second period.

Each of the stages may further include a control terminal. A third control signal may be input to the control terminal, and the third control signal may have the gate-off voltage level for turning off the transistors included in each of the stages during the second period.

According to an embodiment of the present invention, a scan driver including a plurality of stages is configured to transmit a scan signal to a plurality of scan lines of a display device. Each of the stages includes a first transistor, a second transistor, a third transistor, a fourth transistor, a sequential driver, and a concurrent driver.

The first transistor is connected between a first control terminal supplied with a voltage of a first level or a second level and an output terminal for outputting a scan signal having a voltage according to the voltage of the first control terminal, and the first transistor has a gate connected to a first node. The second transistor is connected between a second control terminal supplied with the voltage of the first level or the second level and the first node, and the second transistor has a gate connected to the second control terminal. The third transistor is connected to a first voltage terminal supplied with a first voltage and the output terminal, and the first transistor has a gate connected to a second node. The fourth transistor is connected between the output terminal and a clock terminal supplied with the voltage of the first level or the second level, and the fourth transistor has a gate connected to a third node. The sequential driver is connected to an input terminal for receiving a scan signal from a previous stage, the first voltage terminal, a second voltage terminal for supplying the second voltage, and the first node to the third node. The sequential driver is configured to operate the third and fourth transistors to sequentially output the scan signal having the second voltage to the output terminals of the plurality of stages during a first period. The concurrent driver is connected to the first voltage terminal, the second control terminal, the second node, and the third node, and the concurrent driver is configured to concurrently turn on the first and second transistors such that the scan signal of a same voltage is concurrently output to the output terminals of the plurality of stages during a second period. Before the scan signal of the same voltage is changed from a first level to a second level according to the voltage of the first control terminal, each of the stages is configured to control the first node voltage to be a third voltage that is different from the second voltage.

The third voltage may be different from the voltage of the second level by a fourth voltage. The fourth voltage may be a threshold voltage of the second transistor.

When each of the stages includes PMOS transistors, the voltage of the second level may be a low level voltage and the third voltage may be higher than the low level voltage by the fourth voltage, and when each of the stages includes NMOS transistors, the voltage of the second level may be a high level voltage and the third voltage may be lower than the high level voltage by the fourth voltage.

The second transistor may be connected between the second voltage terminal for receiving a fifth voltage and the first node, and the gate of the second transistor may be connected to the second control terminal for receiving the voltage of the first level or the second level.

Each of the stages may be configured to receive a first control signal and a second control signal. The first control signal may have a gate-off voltage level for turning off the transistors included in each of the stages during the first period and a gate-on voltage level for turning on the transistors included in each of the stages during the second period. The second control signal may have a voltage of the first level or the second level during the second period.

The second period may include a third period and a fourth period, and the concurrent drivers of the stages may be configured to concurrently output the scan signal as the first level corresponding to the second control signal of the first level during the third period and to concurrently output the scan signal as the second level corresponding to the second control signal of the second level during the fourth period.

The concurrent driver may include a fifth transistor and a sixth transistor. The fifth transistor may be connected between the first voltage terminal and the second node, and the fifth transistor may be configured to be turned on in response to a gate-on voltage supplied to the second control terminal. The sixth transistor may be connected between the first voltage terminal and the third node, and the sixth transistor may be configured to be turned on in response to the gate-on voltage supplied to the second control terminal.

Each of the stages may further include a first capacitor connected between the output terminal and the first node.

The sequential driver may include a seventh transistor, an eighth transistor, a ninth transistor, a tenth transistor, and an eleventh transistor. The seventh transistor may be connected between the first voltage terminal and the second node, and the seventh transistor may have a gate connected to the input terminal. The eighth transistor may be connected between the first voltage terminal and the third node, and the eighth transistor may have a gate connected to the second node. The ninth transistor may be connected between the input terminal and the third node, and the ninth transistor may have a gate connected to a first clock terminal. The tenth transistor may be connected between the first voltage terminal and the first node, and the tenth transistor may have a gate connected to a second clock terminal or a third control terminal. The eleventh transistor may be connected between the second node and the second voltage terminal, and the eleventh transistor may have a gate connected to a third clock terminal.

First, second, and third clock signals may be alternately and respectively input to the first, second, and third clock terminals. The first, second, and third clock signals may sequentially have a gate-on voltage level for turning on a transistor during the first period, and each may have three horizontal cycles and a 1/3 duty ratio. The first, second, and third clock signals may have a gate-off voltage level for turning off the transistor during the second period.

First, second, and third clock signals may be alternately and respectively input to the first, second, and third clock terminals, and a third control signal may be input to the third control terminal. The signal that is input to the second clock terminal or the third control terminal may have a gate-on voltage level for turning on a transistor during the first period, and the signal that is input to the second clock terminal or the third control terminal may have a gate-off voltage level for turning off the transistor during the second period.

Each of the stages may further include a second capacitor connected between the first voltage terminal and the second node, and a third capacitor may be connected between the output terminal and the third node.

According to an embodiment of the present invention, a method for driving a scan driver of a display device including a plurality of scan lines is provided. In sequential driving, in response to a plurality of clock signals each alternately having a first level and a second level, the method includes sequentially transmitting a scan signal having a voltage corresponding to the second level to the plurality of scan lines. In concurrent driving, the method includes concurrently applying the scan signal having the voltage corresponding to the first level or the second level to the plurality of scan lines according to a second control signal having the voltage corresponding to the first level or the second level, in a state in which the plurality of clock signals are maintained as the first level and the first control signal is maintained as the second level. In the concurrent driving, before the scan signal is changed from the first level to the second level according to the second control signal, a gate voltage of a first transistor for transmitting the second control signal to an output terminal according to the first control signal is controlled at a first voltage that is different from the voltage corresponding to the second level.

The first voltage may be different from the voltage corresponding to the second level by a second voltage. The second voltage may be a threshold voltage of a second transistor connected to a gate of the first transistor.

When the scan driver includes PMOS transistors, the voltage corresponding to the second level may be a low level voltage and the first voltage may be higher than the low level voltage by the second voltage. When the scan driver includes NMOS transistors, the voltage corresponding to the second level may be a high level voltage and the first voltage may be lower than the high level voltage by the second voltage.

In the sequential driving, the method further includes receiving a third control signal having the second level, and in the concurrent driving, the method further includes receiving the third control signal having the first level.

According to exemplary embodiments of the present invention, the scan driver may perform both sequential switching by sequentially applying a scan signal to a plurality of scan lines and concurrent switching by applying a constant voltage to a plurality of scan lines.

According to an exemplary embodiment of the present invention, in the concurrent switching operation of the scan driver, a circuit structure having an output with a fast and stable switching speed between a high voltage and a low voltage may be provided. Accordingly, the scan driver may be applied to a large, high resolution, and high speed panel.

Also, when comparing with a typical circuit configuration of a scan driver, the number of elements and signals that are used may be reduced such that the circuit configuration may be simplified and the layout area may be reduced. Accordingly, a probability of product deterioration may be reduced such that a yield may be improved.

DETAILED DESCRIPTION OF THE EMBODIMENTS

Figure 1:
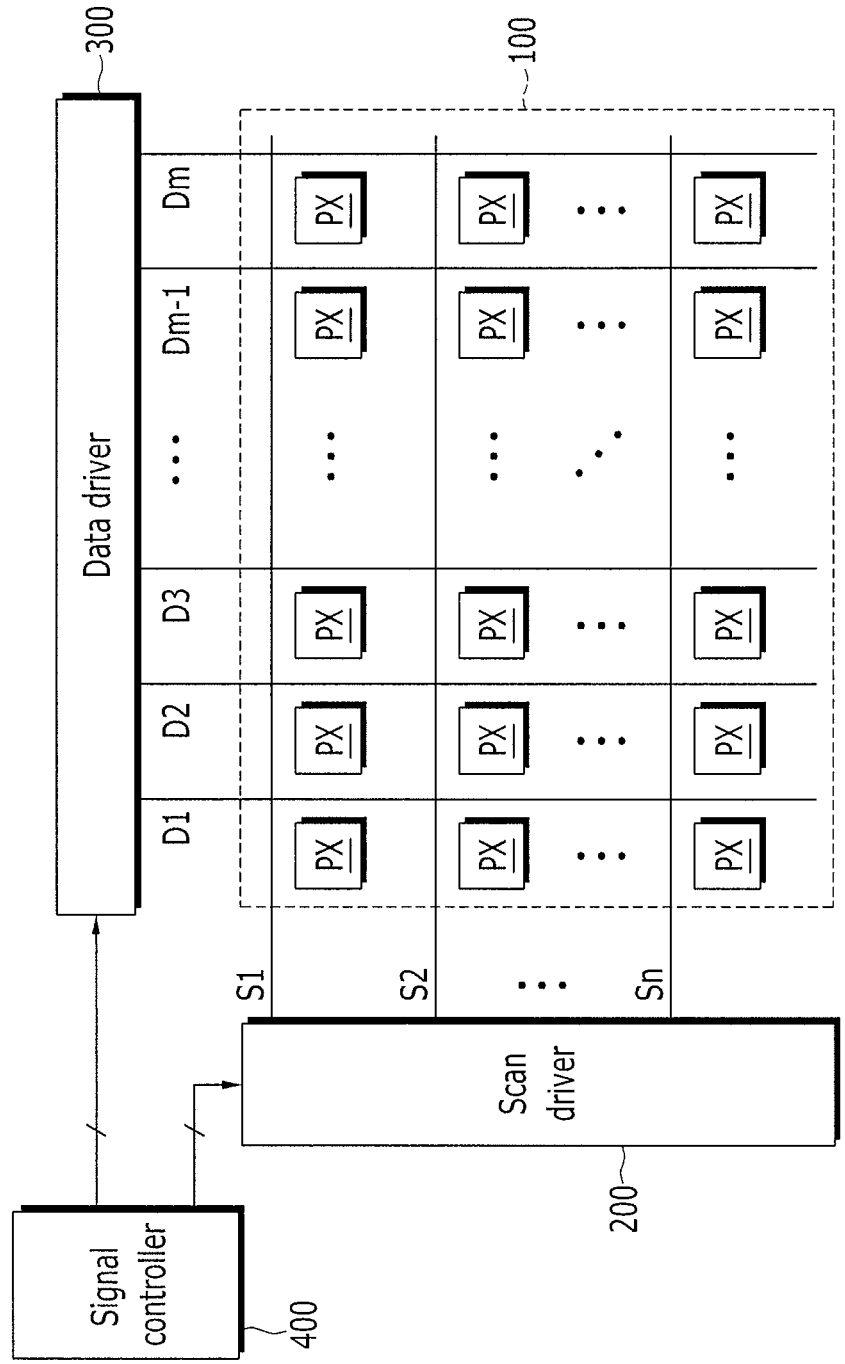
FIG. 1 is a block diagram of a display device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit and scope of the present invention. Accordingly, the drawings and description are to be regarded as illustrative in nature and not restrictive. Like reference numerals designate like elements throughout the specification.

Figure 2:
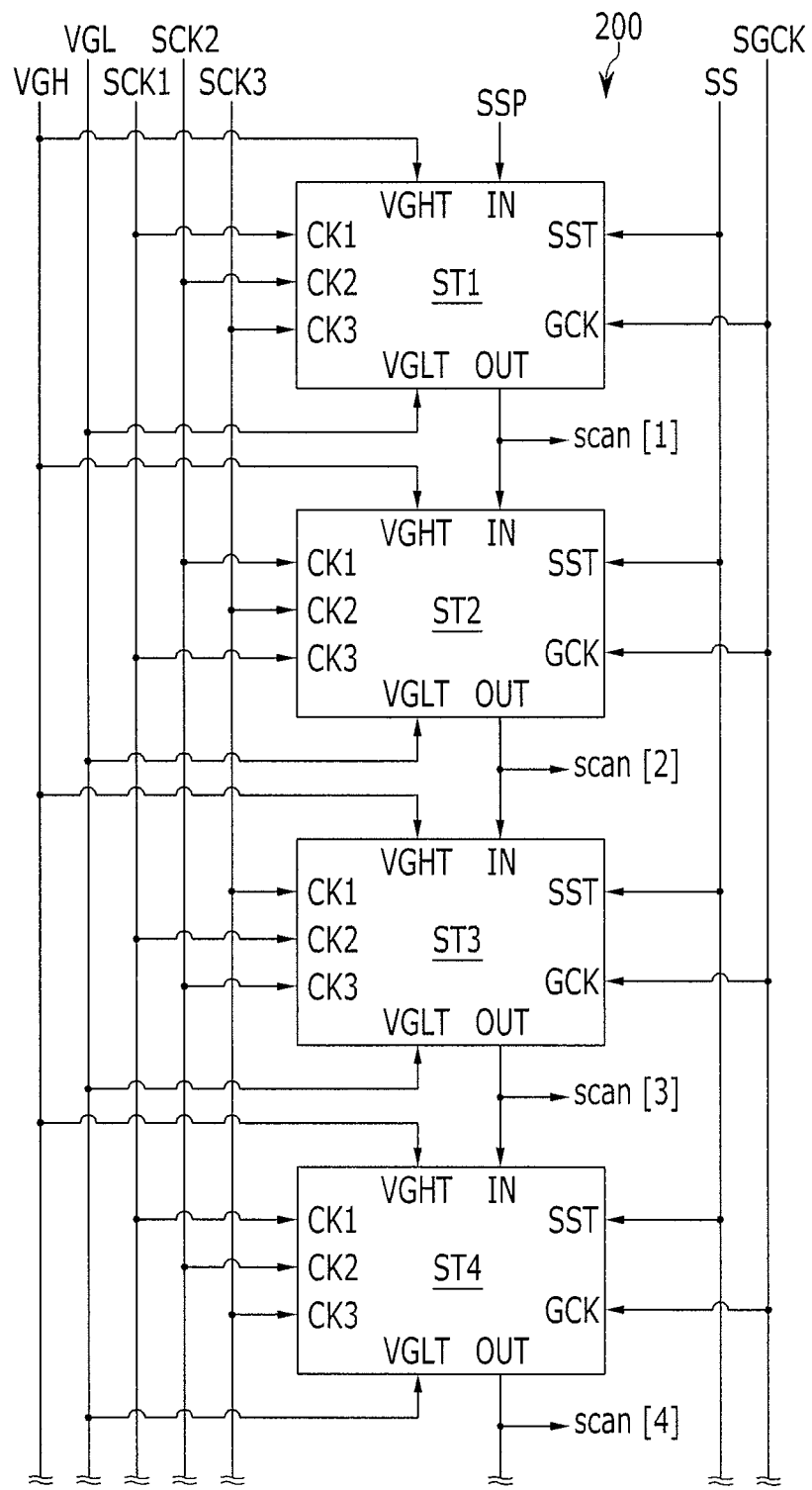
FIG. 2 and FIG. 8 are block diagrams of a scan driver according to exemplary embodiments of the present invention.
Figure 3:
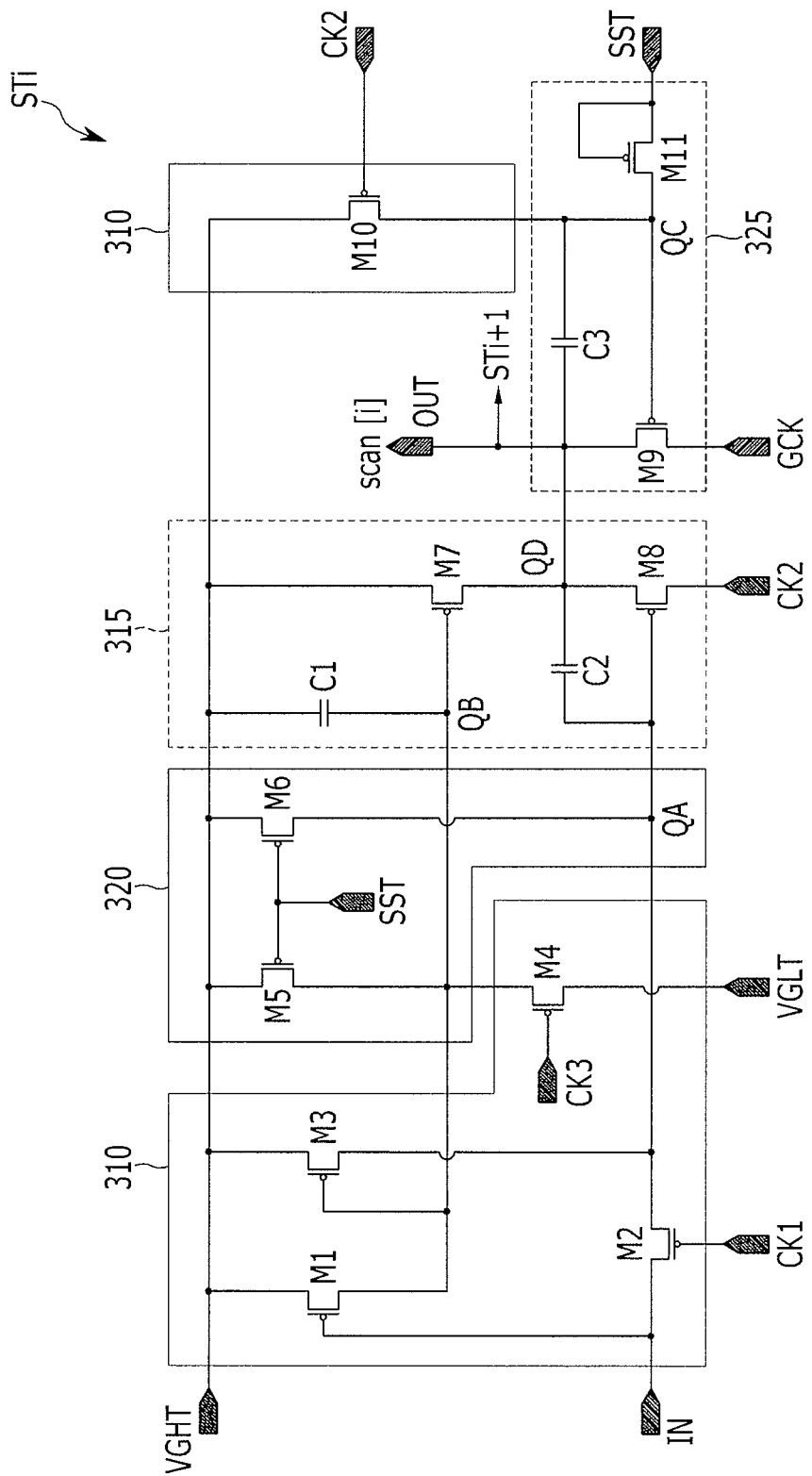
FIG. 3, FIG. 7, FIG. 9, and FIG. 13 are circuit diagrams of one stage of a scan driver according to exemplary embodiments of the present invention.
Figure 8:
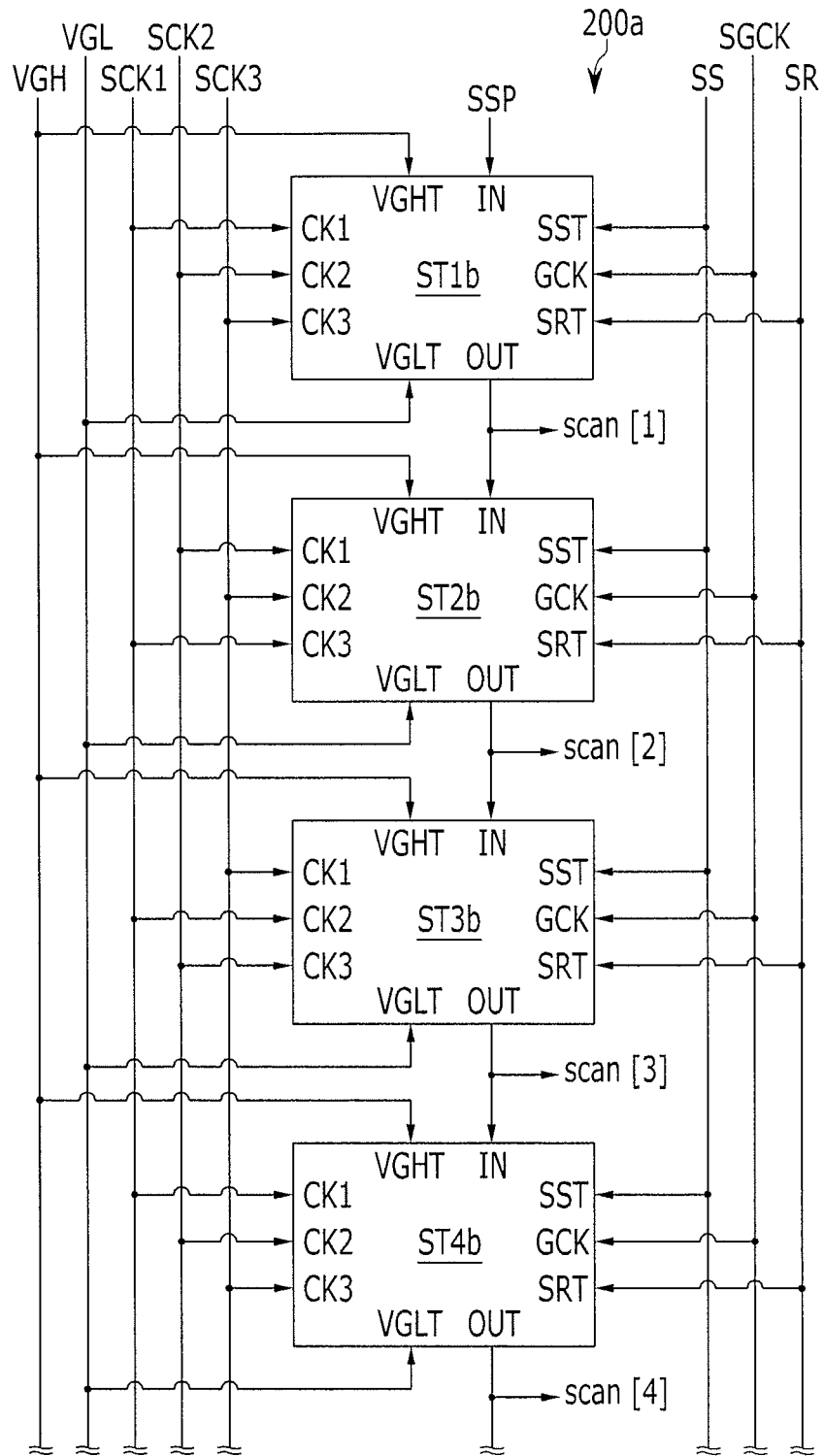

FIG. 1 is a block diagram of a display device according to an exemplary embodiment of the present invention, FIG. 2 and FIG. 8 are block diagrams of a scan driver according to exemplary embodiments of the present invention, and FIG. 3 is a circuit diagram of one stage of the scan driver shown in FIG. 2.

Referring to FIG. 1, a display device includes a display unit 100, a scan driver 200, a data driver 300, and a signal controller 400 for controlling them.

In a view of an equivalent circuit diagram, the display unit 100 includes a plurality of display signal lines S1-Sn and D1-Dm and a plurality of pixels PX connected thereto and arranged in a matrix format. The display unit 100 may include a lower panel and an upper panel (not shown) facing each other.

The display signal lines S1-Sn and D1-Dm include a plurality of scan lines S1-Sn for transmitting scan signals (referred to as "gate signals") and a plurality of data lines D1-Dm for transmitting data signals. The scan lines S1-Sn extend in the row direction and are parallel to each other, and the data lines D1-Dm extend in the column direction and are parallel to each other.

The scan driver 200 is connected with the scan lines S1 to Sn, and applies scan signals, formed of a combination of a gate-on voltage and a gate-off voltage, to the scan lines S1 to Sn. The gate-on voltage is a voltage that is applied to the gate of a transistor, thereby turning on the transistor, and the gate-off voltage is a voltage that is applied to the gate of the transistor, thereby turning off the transistor.

The data driver 300, connected to the data lines D1-Dm, generates the data signals, representing the grayscale of the pixel PX, and applies them to the data lines D1-Dm.

The signal controller 400 controls the operation of the scan driver 200 and the data driver 300.

On the other hand, the pixel PX includes a transistor (not shown), which has the gate connected to the scan line and the source/drain connected to the data line to transmit the data signal from the data line in response to the gate-on voltage from the scan line, and a light emitting region (not shown) that emits light with a gray level according to the data signal of the transistor. Here, when the display device is the liquid crystal display (LCD), the light emitting region may include a capacitor for storing the data signal and a liquid crystal layer for displaying the gray level according to the data signal stored in the capacitor. Also, when the display device is an organic light emitting display, the light emitting region may include a capacitor for storing the data signal, a driving transistor for transmitting an amount of current according to the data signal that is stored in the capacitor, and an organic light emitting diode (OLED) for emitting light with the gray level according to the current from the driving transistor.

The drivers 200, 300, and the controller 400 may be directly mounted on the display unit 100 as at least one integrated circuit chip type, may be mounted on a flexible printed circuit film (not shown) to be attached to the display unit 100 as a tape carrier package (TCP), and may be separately mounted on a flexible printed circuit (FPC) (not shown). Alternatively, the drivers 200, 300, and 400 may be integrated in the display unit 100 along with the signal lines S1-Sn and D1-Dm and the transistors. Also, the drivers 200, 300, and the controller 400 may be integrated as a single chip, and in one embodiment, at least one among them or at least one circuit element forming them may be positioned outside the single chip.

Referring to FIG. 2, the scan driver 200 of FIG. 1 includes a plurality of stages ST1-STn, and receives a high voltage VGH, a low voltage VGL, at least one clock signal SCK1, SCK2, and SCK3, at least one control signal, and a scan start signal SSP. The at least one control signal includes a first control signal SS and a second control signal SGCK. The plurality of stages ST1-STn are connected to a plurality of scan lines S1-Sn of the display device, respectively, and output the scan signals scan[1]-scan[n] to the corresponding scan lines S1-Sn.

Each stage, for example the i-th stage STi, includes an input terminal IN, an output terminal OUT, clock terminals CK1, CK2, and CK3, a first control terminal SST, a second control terminal GCK, a high voltage terminal VGHT, and a low voltage terminal VGLT.

The first control signal SS and the second control signal SGCK are respectively input to the first control terminal SST and the second control terminal GCK of the i-th stage STi. The high voltage VGH and the low voltage VGL are respectively applied to the high voltage terminal VGHT and the low voltage terminal VGLT of the i-th stage STi.

The clock signals SCK1, SCK2, and SCK3 are alternately and respectively input to the clock terminals CK1, CK2, and CK3, of the plurality of stages ST1-STn. In more detail, in the case that I is 3j−2 (hereinafter, j=1, 2, . . . n/3) in the i-th stage STi, the clock terminals CK1, CK2, and CK3 are respectively input with the clock signals SCK1, SCK2, and SCK3, in the case that I is 3j−1, the clock terminals CK1, CK2, and CLK3 are respectively input with the clock signals SCK2, SCK3, and SCK1, and in the case that I is 3j, the clock terminals CK1, CK2, and CK3 are respectively input with the clock signals SCK3, SCK1, and SCK2.

The output terminal OUT of the i-th stage STi outputs the scan signal scan[i], selectively having the gate-on voltage and the gate-off voltage, to the corresponding scan line Si.

The input terminal IN of the i-th stage STi is connected to the output terminal OUT of the previous stage STi−1 such that the input terminal of the i-th stage STi receives the scan signal scan[i−1] of the previous stage STi−1 that is the previous output signal. The output terminal OUT of the i-th stage STi is connected to the input terminal IN of the next stage STi+1 to transmit the scan signal scan[i].

The input terminal IN of the first stage ST1 is input with the scan start signal SSP. Also, the output terminal OUT of the final stage STn is connected to the corresponding scan line Sn.

Here, a time for scanning one scan line is referred to as one horizontal cycle 1H. The clock signals SCK1, SCK2, and SCK3 each have a cycle of 3H and a duty ratio of 1/3, and the phase difference between two neighboring clock signals is 1H. Therefore, during a period when one of the three clock signals SCK1, SCK2, and SCK3 has a low voltage, two clock signals have a high voltage.

During the period when the scan driver 200 sequentially applies the gate-on voltage to the plurality of scan lines S1-Sn, the first control signal SS may have the gate-off voltage. On the other hand, during the period when the scan driver 200 concurrently (e.g., simultaneously) applies the gate-on voltage to a plurality of scan lines S1-Sn, the first control signal SS and the second control signal SGCK may have the gate-on voltage, and during the period when the scan driver 200 concurrently (e.g., simultaneously) applies the gate-off voltage to the plurality of scan lines, the first control signal SS and the second control signal SGCK may have the gate-off voltage.

Referring to FIG. 3, each stage, for example the i-th stage STi, includes a sequential switching unit 310, a sequential output unit 315, a concurrent switching unit 320 (e.g., a simultaneous switching unit), and a concurrent output unit 325 (e.g., a simultaneous output unit). They include PMOS (P-channel metal-oxide semiconductor) transistors M1-M11 and capacitors C1, C2, and C3. When using the PMOS transistors, the gate-on voltage is a low voltage and the gate-off voltage is a high voltage. Alternatively, the transistors M1-M11 may be formed of an NMOS (N-channel metal-oxide semiconductor), and in this case, the gate-on voltage is the high voltage and the gate-off voltage is the low voltage.

The sequential switching unit 310 includes transistors M1-M4 and M10 that are connected to the input terminal IN, the high voltage terminal VGHT, the low voltage terminal VGLT, and the clock terminals CK1, CK2, and CK3.

The input terminal IN is connected to the gate of the transistor M1 and the drain of the transistor M2. The node QB is connected to the drain of the transistor M1, the gate of the transistor M3, and the source of the transistor M4. The node QA is connected to the source of the transistor M2 and the drain of the transistor M3. The sources of the transistors M1, M3, and M10 are connected to the high voltage terminal VGHT, and the drain of the transistor M4 is connected to the low voltage terminal VGLT. The gate of the transistor M2 is connected to the clock terminal CK1, the gate of the transistor M4 is connected to the clock terminal CK3, and the gate of the transistor M10 is connected to the clock terminal CK2. The drain of the transistor M10 is connected to the node QC.

The sequential output unit 315 is connected to the output terminal OUT to output the scan signal scan[i] to the corresponding scan line Sn in the sequential switching driving. The sequential output unit 315 includes transistors M7 and M8 and capacitors C1 and C2, and is connected to the high voltage terminal VGHT, the clock terminal CK2, and the output terminal OUT.

The drain of the transistor M7 and the source of the transistor M8 are connected to the node QD that is connected with the output terminal OUT. The source of the transistor M7 is connected to the high voltage terminal VGHT, and the drain of the transistor M8 is connected to the clock terminal CK2.

The gate of the transistor M7 is connected to the node QB, and the gate of the transistor M8 is connected between the node QA. Also, the capacitor C1 is connected to the gate and the source of the transistor M7, and the capacitor C2 is connected between the gate and the source of the transistor M8. The capacitors C1 and C2 may include a parasitic capacitance between the gate and the source of the transistors M7 and M8 formed in the manufacturing process.

The concurrent switching unit 320 includes transistors M5 and M6, and is connected to the first control terminal SST, the high voltage terminal VGHT, and the nodes QA and QB. The gates of the transistors M5 and M6 are commonly connected to the first control terminal SST, and the sources of the transistors M5 and M6 are connected to the high voltage terminal VGHT. The drain of the transistor M5 is connected to the node QB, and the drain of the transistor M6 is connected to the node QA.

The concurrent output unit 325 is connected to the output terminal OUT to output the scan signal scan[i] to the corresponding scan line Sn in the concurrent switching driving. The concurrent output unit 325 includes transistors M9 and M11 and a capacitor C3, and is connected to the first control terminal SST and the second control terminal GCK in addition to the output terminal OUT.

The source of the transistor M9 is connected to the node QD to which the output terminal OUT is connected. The gate of the transistor M9 and the source of the transistor M11 are connected to the node QC, and the drain of the transistor M9 is connected to the second control terminal GCK. The drain of the transistor M11 is connected to the first control terminal SST, and the gate of the transistor M11 is connected to the drain for a diode connection (diode-connecting the transistor M11). Also, the capacitor C3 is connected between the node QD to which the source of the transistor M9 is connected and the node QC to which the gate of the transistor M9 is connected.

Next, an operation of the scan driver according to an exemplary embodiment of the present invention will be described with reference to FIG. 4 and FIG. 5.

Figure 4:
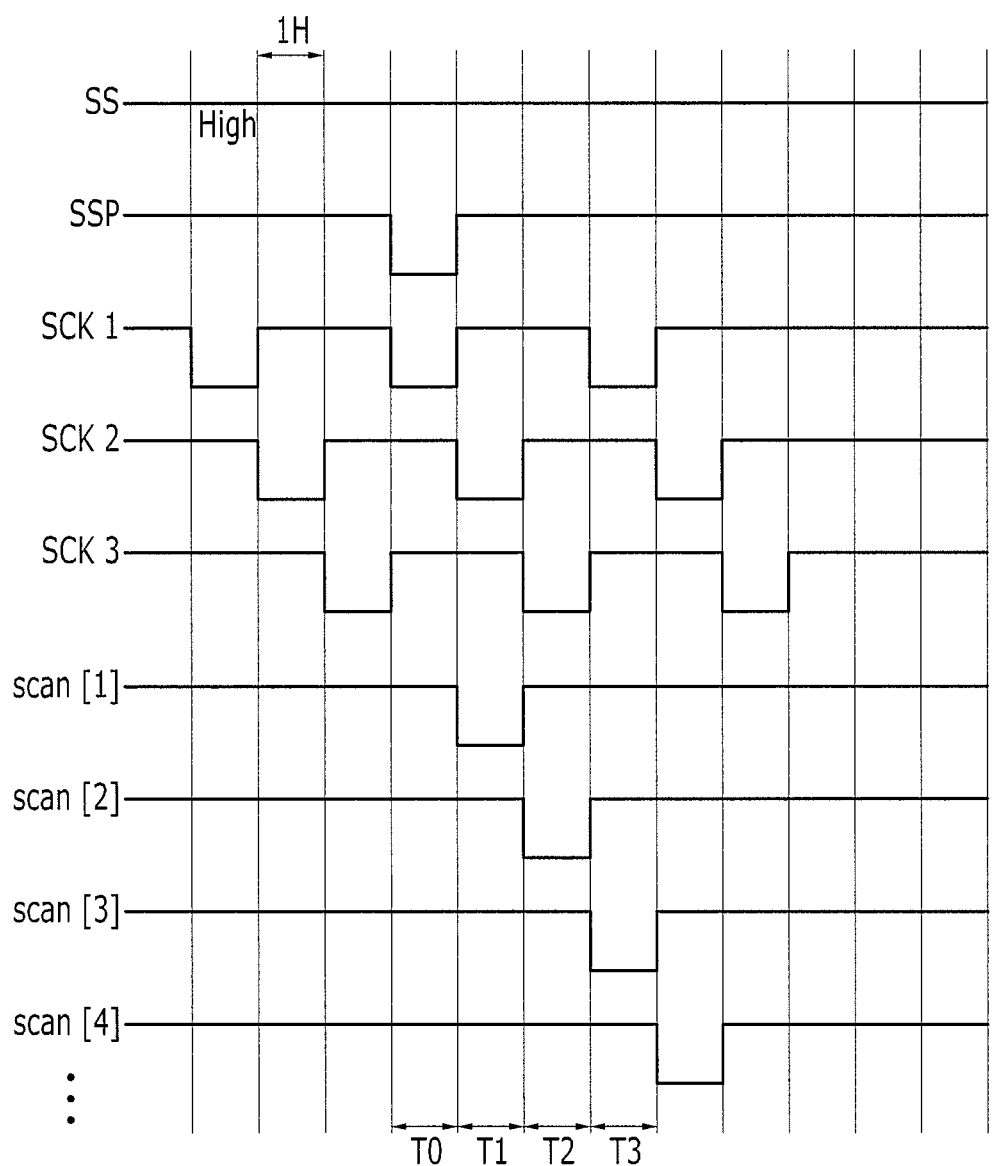
FIG. 4 and FIG. 10 are signal timing diagrams illustrating sequential switching driving of a scan driver according to exemplary embodiments of the present invention.
Figure 5:
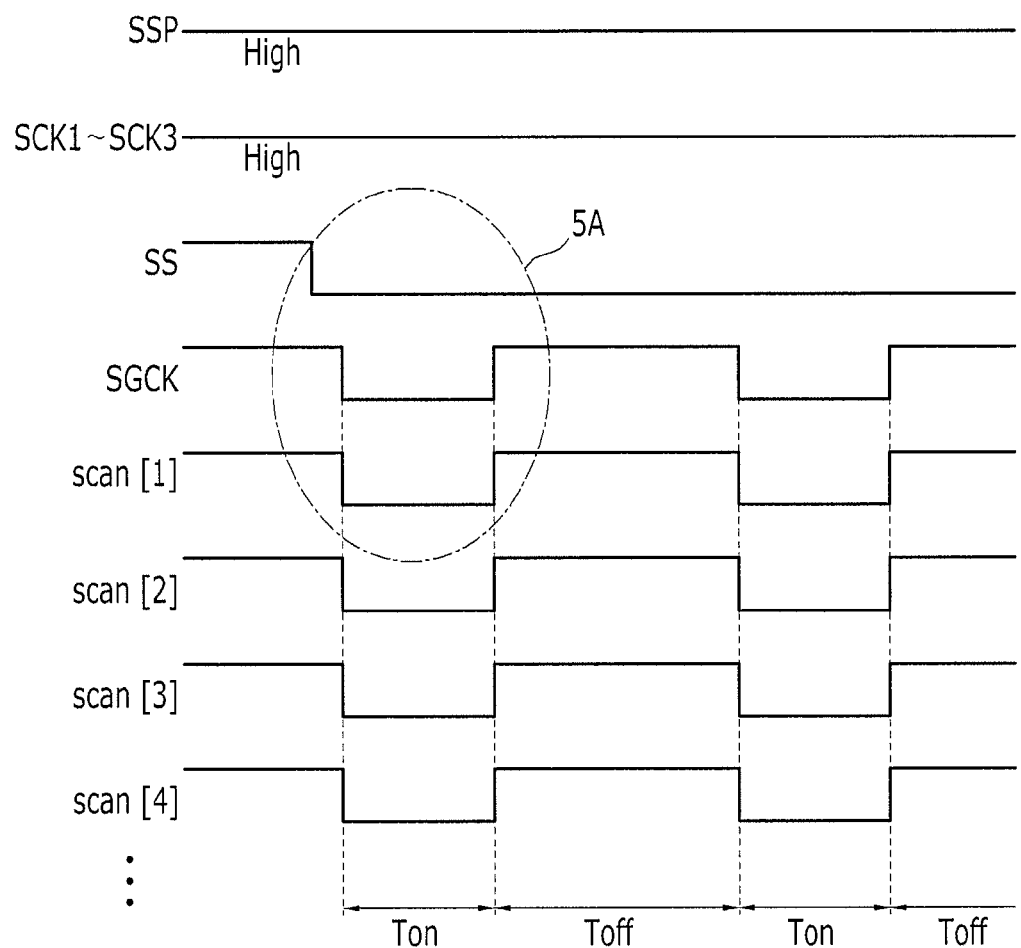
FIG. 5 and FIG. 11 are signal timing diagrams illustrating concurrent (e.g., simultaneous) switching driving of a scan driver according to exemplary embodiments of the present invention.

FIG. 4 is a signal timing diagram illustrating a sequential switching mode of a scan driver according to an exemplary embodiment of the present invention, and FIG. 5 is a signal timing diagram illustrating a concurrent switching mode of a scan driver according to an exemplary embodiment of the present invention.

In FIG. 4 and FIG. 5, for better understanding and ease of description, the high level of the clock signal and the high level of the control signal are the same as the high voltage VGH of the high voltage terminal VGHT, and the low levels of the clock signal and the control signal are the same as the low voltage VGL of the low voltage terminal VGLT. Also, the transistors of each stage $ST_i$ are PMOS transistors such that it is assumed that the transistor is turned off in response to the high level of the clock signal or the control signal, that is, the high voltage, and the transistor is turned on in response to the low level of the clock signal or the control signal, that is, the low voltage.

Firstly, the shift register function of the scan driver 200 in sequential switching driving of the scan driver 200 will be described with reference to FIG. 4.

Referring to FIG. 4, the first control signal SS that is maintained as the high level during a sequential switching driving period is transmitted such that the first control terminal SST has the high voltage VGH. Also, the clock terminal CK2, receiving one of the clock signals SCK1, SCK2, and SCK3 that are switched with the low level, has the low voltage VGL such that the transistor M10 is turned on. Thus, the transistor M10 transmits the high voltage VGH to the node QC. The transistors M5, M6, M9, and M11 are in the turn-off state in accordance with the first control terminal SST and the transistor M10 during the sequential switching driving period. Accordingly, the concurrent switching unit 320 and the concurrent output unit 325, including the transistors M5, M6, M9, and M11, are not operated such that the output of the scan signal of the sequential switching driving period is not affected. Here, the transistor M9 is in the turn-off state such that the waveform of the second control signal SGCK that is transmitted to the second control terminal GCK may be any waveform and is not shown in FIG. 4.

During the sequential switching driving period, the scan start signal SSP, having the low voltage VGL during the period T0 that is equal to 1H, is applied such that the scan operation is started. In the period T0, the clock signal SCK1 has the low voltage VGL, and the clock signals SCK2 and SCK3 have the high voltage VGH such that the input terminal IN and the clock terminal CK1 receive the low voltage and the clock terminals CK2 and CK3 receive the high voltage in the first stage ST1. Thus, the transistor M2 is turned on such that the voltage at the node QA is decreased to the low voltage, and the transistor M1 is turned on such that the voltage at the node QB is increased to the high voltage. Accordingly, the transistor M7 is turned off and the transistor M8 is turned on. Therefore, the output terminal OUT of the first stage ST1, that is, the voltage of the scan signal scan[1], is maintained as the high voltage of the clock terminal CK2, and the capacitor C2 stores the voltage corresponding to the difference between the high voltage and the low voltage that are respectively maintained at the source and the gate of the transistor M8.

Next, during the period T1, the clock signal SCK2 has the low voltage and the scan start signal SSP has the high voltage. Thus, in the first stage ST1, the clock terminal CK2 receives the low voltage, and the input terminal IN and the clock terminals CK1 and CK3 receive the high voltage. Accordingly, the transistors M1, M2, and M4 are turned off such that the node QA and the node QB enters the floating state. Accordingly, the transistor M7 is maintained in the turn-off state, and the node QA is at the low voltage such that the transistor M8 is maintained in the turn-on state, and thereby the voltage of the output terminal OUT is decreased to the low voltage by the clock terminal CK2. Here, the voltage of the node QA is decreased to a voltage that is lower than the low voltage VGL by a bootstrap effect due to the capacitor C2 such that the transistor M8 is completely turned on, and thereby the voltage of the output terminal OUT becomes the low voltage VGL. That is, the first stage ST1 outputs the scan signal scan[1] having the low voltage VGL, i.e., the gate-on voltage. As described above, the first stage ST1 turns on the transistor M8 while maintaining the input at the low voltage that is transmitted through the transistor M2 at the period T0 through the capacitor C2 such that the low voltage of the clock signal SCK2 may output as the scan signal scan[1].

The scan signal scan[1] and the clock signal SCK2 have the low voltage and the clock signals SCK1 and SCK3 have the high voltage at the period T1, such that the input terminal IN and the clock terminal CK1 are at the low voltage and the clock terminals CK2 and CK3 are at the high voltage in the second stage ST2. Accordingly, the second stage ST2 is operated like the first stage ST1 in the period T0 such that the scan signal scan[2] having the high voltage, that is, the gate-off voltage, is output to the output terminal OUT.

Next, the clock signal SCK3 has the low voltage during the period T2 such that the clock terminal CK3 receives the low voltage in the first stage ST1, and the input terminal IN and the clock terminals CK1 and CK2 receive the high voltage.

Thus, the transistor M4 is turned on such that the node QB is decreased to the low voltage and the transistor M7 is turned on. Also, the transistor M3 is turned on such that the node QA is increased to the high voltage and the transistor M8 is turned off. Accordingly, the first stage ST1 outputs the scan signal scan[1] having the high voltage to the output terminal OUT by turning on the transistor M7.

In the period T2, the clock signal SCK3 has the low voltage and the scan signal scan[1] and the clock signals SCK1 and SCK2 have the high voltage, such that the second stage ST2 is operated like the first stage ST1 in the period T1 such that the scan signal scan[2] of the low voltage is output to the output terminal OUT by the clock terminal CK2 having the low voltage.

Next, the third stage ST3 receives the scan signal scan[2] of the low voltage from the input terminal IN and is operated like the first stage ST1 in the period T0 by the clock terminal CK1 of the low voltage and the clock terminals CK2 and CK3 of the high voltage to output the scan signal scan[3] of the high voltage.

Then, the clock signal SCK1 has the low voltage during the period T3 such that the clock terminal CK1 receives the low voltage in the first stage ST1, and the input terminal IN and the clock terminals CK2 and CK3 receive the high voltage. Thus, the transistor M2 is turned on such that the node QA maintains the high voltage and the transistor M8 maintains the turn-off state. The transistors M1 and M4 are turned off such that the node QB is in the floated state and the transistor M7 maintains the turn-on state. Accordingly, the first stage ST1 outputs the scan signal scan[1] of the high voltage to the output terminal OUT. That is, the first stage ST1 turns on the transistor M7 after the period T2 such that the scan signal scan[1] of the high voltage may be output.

The clock signal SCK1 has the low voltage and the scan signal scan[1] has the high voltage at the period T3, such that the second stage ST2 is operated like the first stage ST1 in the period T2 to output the scan signal scan[2] of the high voltage. Accordingly, the third stage ST3 is operated like the first stage ST1 in the period T1 with the input terminal IN at the high voltage and the clock terminal CK2 at the low voltage such that the scan signal scan[3] of the low voltage is output.

As described above, the clock terminal CK2 connected to the transistor M10 has the low voltage and the first control terminal SST has the high voltage in the state before the start of the sequential switching driving, and the scan driver 200 may sequentially output the low voltage, that is, the scan signals scan[1]-scan[n] having the gate-on voltage, to a plurality of scan lines S1-Sn in response to the low voltage waveform of the clock signals SCK1, SCK2, and SCK3.

The sequential switching driving of the scan driver 200 according to an exemplary embodiment of the present invention is not limited to the exemplary embodiment of FIG. 4, and may be equally applied to overlapping driving by expanding the number of clock signals to six clock signals and the width of each clock signal to 2H.

Next, a concurrent switching operation of the scan driver 200 will be described with reference to FIG. 5.

Referring to FIG. 5, the clock signals SCK1, SCK2, and SCK3 and the scan start signal SSP have the high voltage during the concurrent switching period. Thus, the transistors M1, M2, M4, and M10 are turned off.

In the state that the first control signal SS is maintained as the low voltage, when the second control signal SGCK is changed into the low level, a concurrent-on period Ton is started in the concurrent switching period.

When the first control signal SS is maintained as the low voltage, the first control terminal SST has the low voltage in a plurality of stages ST1-STn such that the transistors M5, M6, and M11 are turned on.

Accordingly, the voltages at the nodes QA and QB are increased to the high voltage and the voltage at the node QC is decreased to the low voltage. The transistors M7 and M8 are turned off by the high voltage at the nodes QA and QB such that the output by the transistors M7 and M8 is prevented. During the concurrent switching period, the sequential switching driver 310 and the sequential output unit 315 of each stage of the scan driver 200 are not operated.

Here, the transistor M9 is turned on by the low voltage at the node QC such that the voltage of the output terminal OUT is decreased to the low voltage at the second control terminal GCK during the concurrent-on period Ton. Here, the voltage of the node QC is decreased to a lower voltage than the low voltage VGL by a bootstrap effect due to the capacitor C3, and the transistor M9 is completely and stably turned on such that the voltage of the output terminal OUT becomes the low voltage VGL. The more detailed description of the driving waveforms corresponding to the 5A section of FIG. 5 will be given with reference to FIG. 6 below.

By this operation, the plurality of stages ST1-STn output the low voltage, that is, the scan signals scan[1]-scan[n] having the gate-on voltage, to a plurality of scan lines S1-Sn, such that the transistors of the pixels PX having the gate connected to the scan lines S1-Sn may all be turned on.

Next, the second control signal SGCK has the high voltage in the state that the first control signal SS still maintains the low voltage in a concurrent-off period Toff in the concurrent switching period.

Thus, in the plurality of stages ST1-STn, the voltage of the output terminal OUT is output as the high voltage of the second control signal SGCK that is transmitted to the second control terminal GCK when the transistors M9 and M11 are still turned on. Accordingly, the plurality of stages ST1-STn output the high voltage, that is, the scan signals scan[1]-scan[n] having the gate-off voltage, to the plurality of scan lines S1-Sn such that the transistors, having the gate connected to the scan lines S1-Sn, are all turned off.

Figure 6:
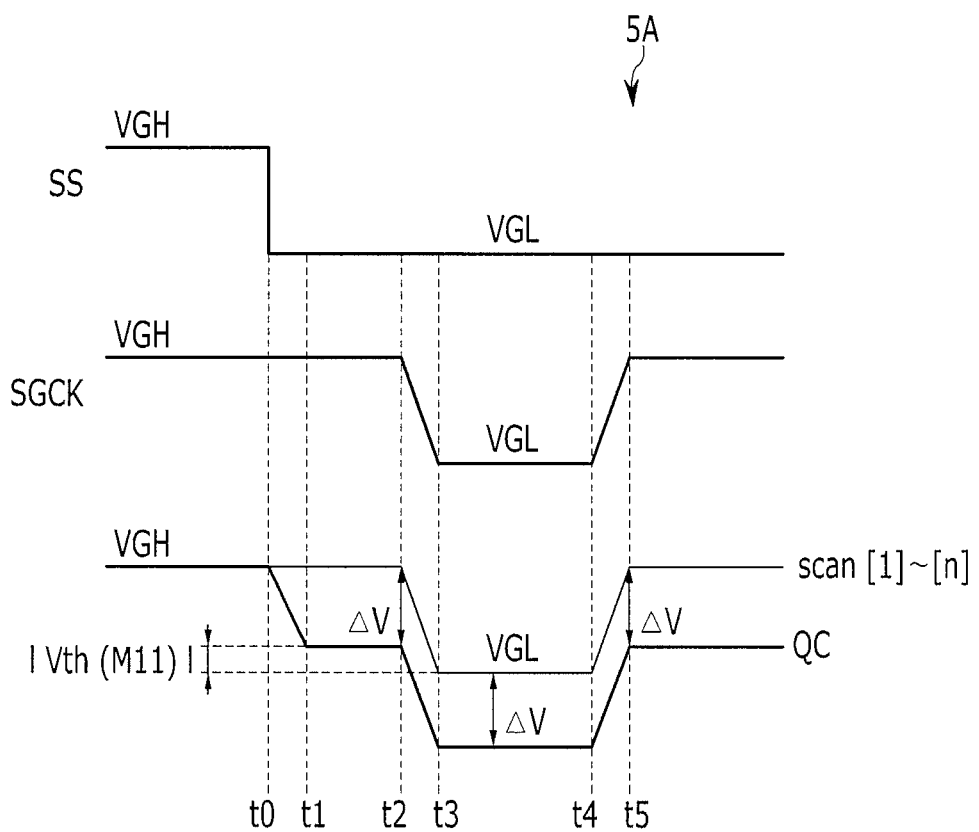
FIG. 6 and FIG. 12 are enlarged views of a part of the signal timing diagram shown in FIG. 5 and FIG. 11.

FIG. 6 is a view illustrating the voltage levels of the driving waveforms 5A shown in FIG. 5 in more detail, and is based on the circuit diagram of the concurrent output unit 325 of the scan driver 200, to stably execute the concurrent on/off driving in the concurrent switching period.

In general, the transistor connected to the output terminal of the scan driver is turned on by the very small voltage Vgs between the gate and the source of the transistor when the output signal (e.g., the scan signal) is changed from the high level to the low level. The reason is that the speed at which the gate voltage is decreased by the voltage of the signal input to the gate terminal of the transistor is similar to the speed at which the source voltage is decreased by the terminal voltage connected to the drain terminal of the transistor. That is, the voltage waveform of the gate terminal of the transistor and the waveform of the output signal of the output terminal connected the source terminal of the transistor are almost concurrently (e.g., simultaneously) changed from the high level to the low level such that the voltage Vgs between the gate and the source of the transistor is not large at the time the capacitor connected between the gate and the source of the transistor starts to bootstrap.

Accordingly, for driving a panel load connected to the output terminal, the transistor is driven by the small voltage Vgs between the gate and the source such that the on resistance gets larger, and a drawback is that the change to the low level from the high level of the scan signal output from the output terminal becomes slow.

To solve this problem, the circuit structure of the concurrent output unit 325 of the scan driver 200, according to an exemplary embodiment of the present invention that was previously explained in FIG. 3, is used, and the driving waveforms of the concurrent (e.g., simultaneous) conversion from the high level to the low level for the scan signal and the output thereof are shown in FIG. 6.

Before the time t0, the voltage of the node QC and the output signals of the plurality of stages ST1-STn, that is, the plurality of scan signals scan[1]-scan[n], maintain the high voltage VGH. The scan signals scan[1]-scan[n] are converted and output from the high voltage to the low voltage VGL during the concurrent-on period Ton, and in more detail, they start to be converted into the low voltage state at the time t2 and start to be converted into the high voltage state at the time t4 in FIG. 6.

When the first control signal SS is changed from the high voltage to the low voltage and is transmitted to the first control terminal SST at the time t0, the transistor M11 is turned on such that the voltage of the node QC starts to be decreased to the low voltage VGL.

Next, when the voltage of the node QC is decreased to the voltage of the level that is higher than the gate node voltage (i.e., the low voltage VGL of the first control signal SS) of the transistor M11 at the time t1 by the threshold voltage (|Vth (M11)|) of the transistor M11, the transistor M11 is turned off such that the voltage of the node QC is almost constantly or substantially maintained. The voltage of the node QC is reduced to the low level and maintained by the transistor M11 from the time t0 to the time t2 such that the transistor M9 is turned on, however the second control terminal GCK that is connected to the drain of the transistor M9 is in the high voltage state such that the plurality of scan signals scan[1]-scan[n] are still in the high voltage state.

When the second control signal SGCK starts to be changed into the low level at the time t2, the voltage at the second control terminal GCK is decreased to the low voltage and the transistor M9 is turned on such that the plurality of scan signals scan[1]-scan[n] are concurrently, (e.g., simultaneously) decreased to the low voltage. Here, the voltage change amount of the scan signals scan[1]-scan[n] is substantially reflected in the voltage change amount of the node QC by the coupling effect of the capacitor C3. Accordingly, in the timing diagram of FIG. 6, it is shown that the waveforms of the scan signals scan[1]-scan[n] and the waveform of the node QC is substantially the same during the period between the time t2 and the time t3.

When the second control signal SGCK and the scan signals scan[1]-scan[n] reach the level of the low voltage VGL at the time t3, the voltage of the node QC becomes "2VGL−VGH+ |Vth (M11)|" that is a much lower value than the low voltage VGL. For concurrently (e.g., simultaneously) outputting the scan signals scan[1]-scan[n] of the low voltage VGL to the output terminal OUT, the voltage of the node QC, as the gate voltage of the transistor M9 that is connected to the output terminal OUT, is driven sufficiently lower than the low voltage VGL as the source voltage of the transistor M9 such that the voltage between the gate and the source of the transistor M9 is sufficiently large. That is, the voltage between the gate and the source of the transistor M9 at the time t3 is the voltage difference ΔV between the low voltage VGL of the scan signals scan[1]-scan[n] and the voltage "2VGL−VGH+|Vth (M11)|" of the node QC, and the voltage difference ΔV is as shown in Equation 1.

$$\Delta V = VGH - VGL - |Vth(M11)|$$  Equation 1

Accordingly, the voltage difference ΔV is a substantially large value such that the on resistance of the transistor M9 is small, and thereby the voltage of the scan signals scan[1]-scan[n] may be quickly changed from the high level to the low level for driving the large panel load by a transistor of a small size.

When the second control signal SGCK is increased to the high voltage from the time t4, the transistor M9 is still in the turn-on state such that the voltages of the scan signals scan [1]-scan[n] are increased to the high voltage. That is, the transistor M9 passes the waveform of the second control signal SGCK, which is at the high voltage as in the time t0, as the plurality of scan signals scan[1]-scan[n]. Likewise, the change amount that the voltage of the scan signals scan[1]-scan[n] is changed into the high voltage by the capacitor C3 is reflected by the voltage change amount of the node QC such that the voltage of the node QC is increased. Next, when the second control signal SGCK becomes the high voltage VGH at the time t5, the plurality of scan signals scan[1]-scan[n] have the high voltage VGH such that the concurrent-off period Toff is started. Although not shown in FIG. 6, when the first control signal SS is changed into the high level and the clock terminal CK2 has the low voltage by the clock signal including the low voltage waveform, the voltage of the node QC becomes the high voltage VGH, and then the transistor M9 is turned off.

Figure 7:
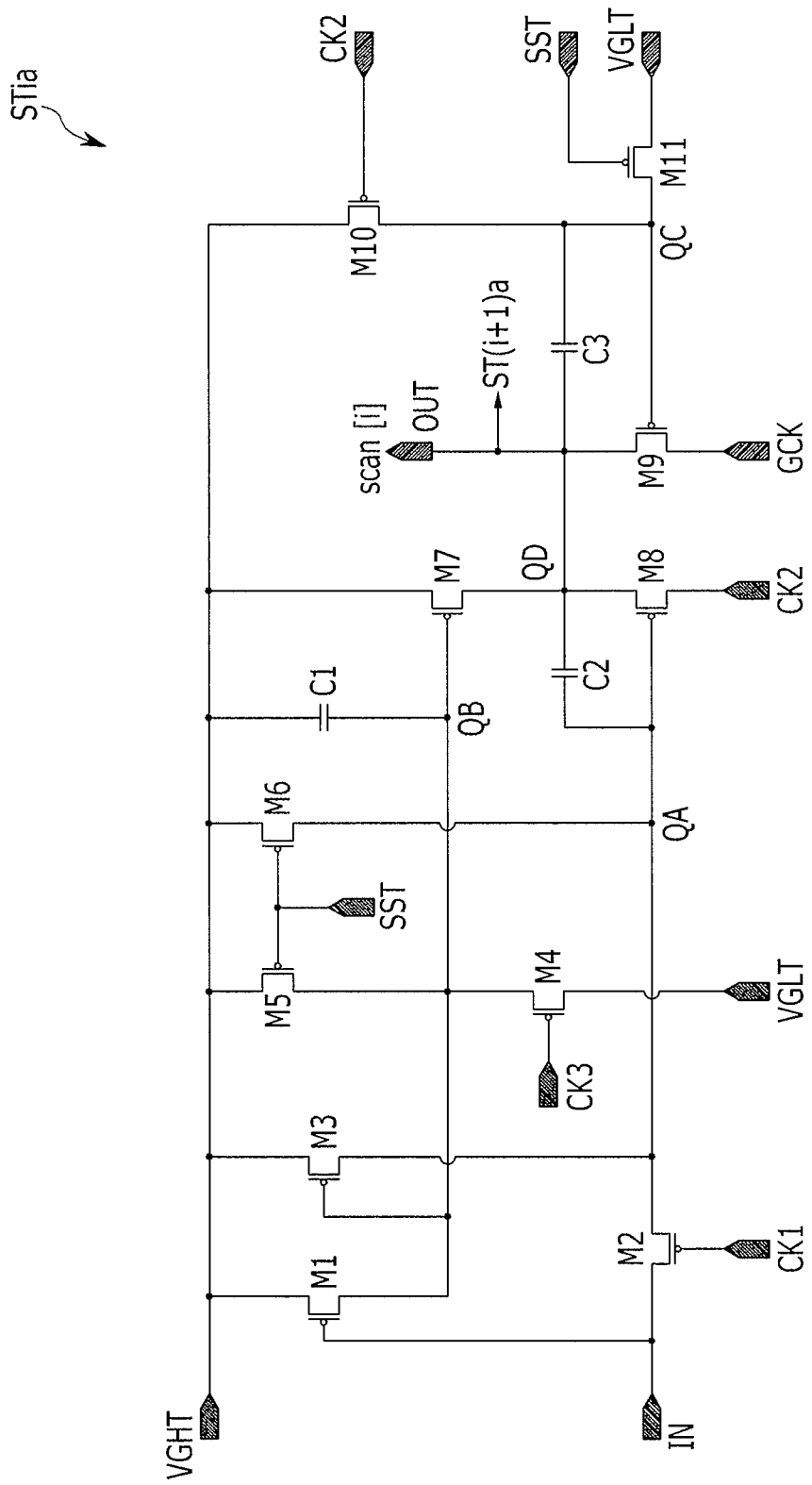

FIG. 7 is a circuit diagram of one stage of the scan driver 200 according to another exemplary embodiment of the present invention.

Referring to FIG. 7, different from the stage STi of FIG. 3, the gate of the transistor M11 is connected to the first control terminal SST in each stage STia, and the drain of the transistor M11 is connected to the low voltage terminal VGLT. In the exemplary embodiment of FIG. 3, when the first control terminal SST receives the low voltage, the transistor M11 is turned on such that the voltage of the node QC becomes the low voltage. However, in the exemplary embodiment of FIG. 7, when the first control terminal SST receives the low voltage, the transistor M11 is turned on and the low voltage VGL is applied from the low voltage terminal VGLT, to which the drain of the transistor M11 is connected, such that the voltage of the node QC becomes the low voltage. In the exemplary embodiment of FIG. 7, the driving operation and the driving waveforms of the remaining circuit elements are substantially the same as described above such that the description of the driving operation is omitted.

Figure 9:
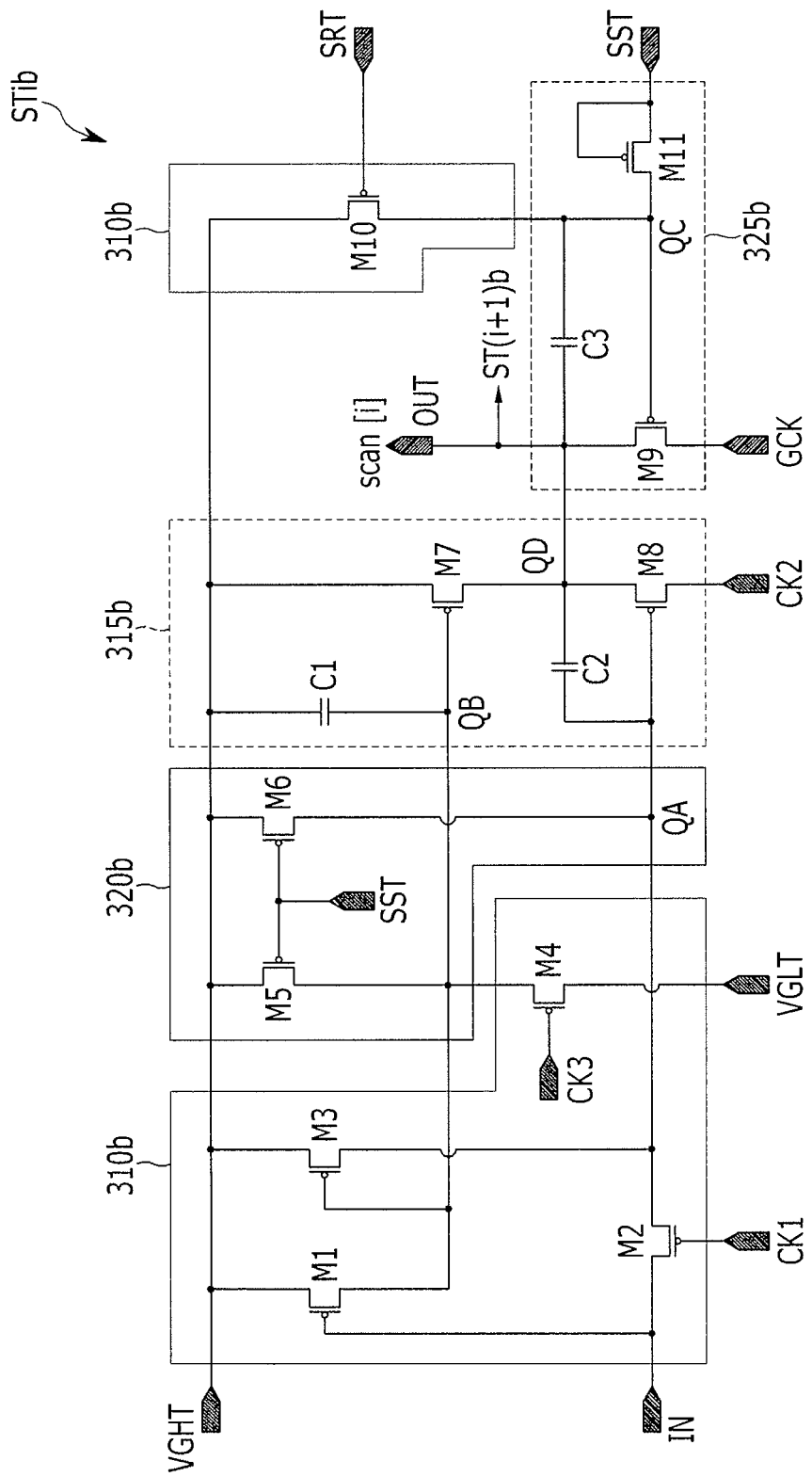
Figure 10:
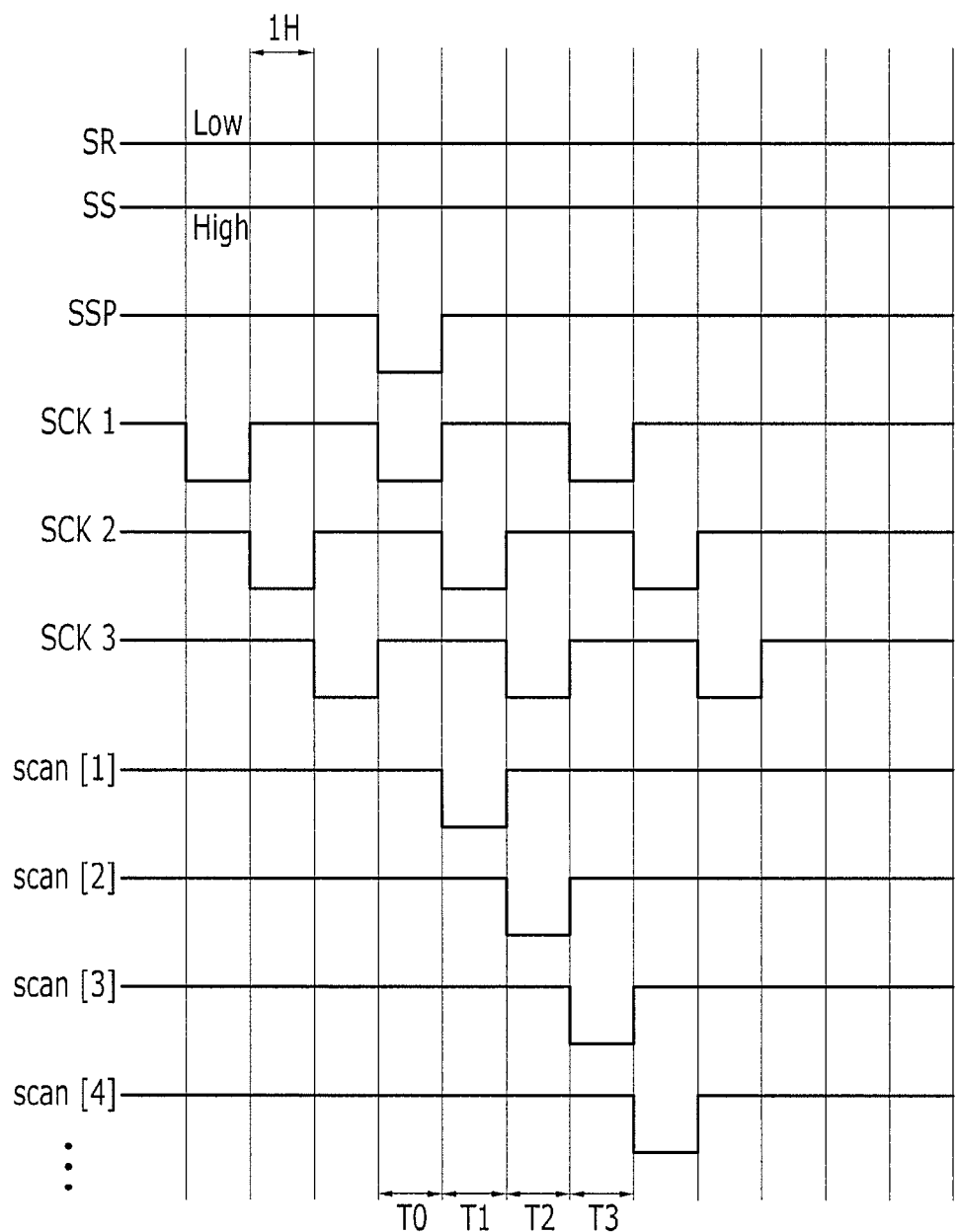
Figure 11:
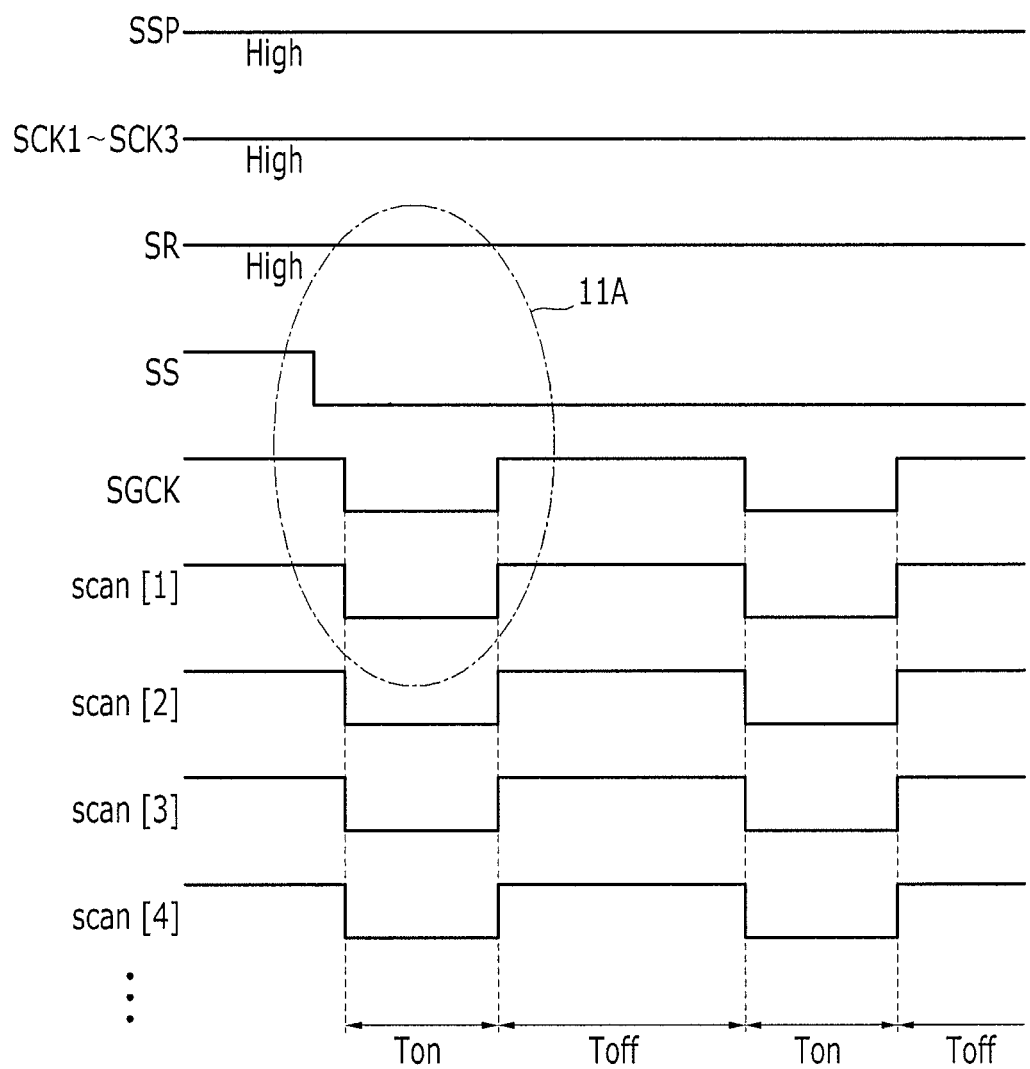

FIG. 8 is a block diagram of a scan driver 200a according to another exemplary embodiment of the present invention. FIG. 9 is a circuit diagram of one stage of the scan driver 200a shown in FIG. 8. FIG. 10 is a signal timing diagram illustrating the sequential switching driving of the scan driver 200a shown in FIG. 8. FIG. 11 is a signal timing diagram illustrating the concurrent switching driving of the scan driver 200a shown in FIG. 8.

Referring to FIG. 8, the scan driver 200a includes a plurality of stages ST1b-STnb that receive the high voltage VGH, the low voltage VGL, the three clock signals SCK1, SCK2, and SCK3, at least one control signal, and the scan start signal SSP. The clock signals SCK1, SCK2, and SCK3 each have a cycle period of 3H and a duty ratio of 1/3, and the phase difference of two neighboring clock signals is 1H, like the exemplary embodiment of FIG. 2. However, the present invention is not limited to this driving method. For example, six clock signals may be included, and the cycle period of the clock signal may be expanded to 6H such that the phase difference between the clock signals may be driven to be overlapped by 1H.

In the exemplary embodiment of FIG. 8, the control signal may include the first control signal SS, the second control signal SGCK, and a third control signal SR.

Each stage STib has substantially the same structure as the stage STi shown in FIG. 2. However, each stage STib may include a third control terminal SRT to receive the third control signal SR.

In FIG. 8, the input process in which the clock signals SCK1, SCK2, and SCK3 are alternately and respectively input to the clock terminals CK1, CK2, and CK3 of the plurality of stages ST1b-STnb is substantially the same as that of FIG. 2 such that the description thereof is omitted.

FIG. 9 is a circuit diagram of an i-th stage STib among the plurality of stages ST1b-STnb shown in FIG. 8, and it has a circuitry similar to that of FIG. 3.

Referring to FIG. 9, each stage, for example the i-th stage STib, includes a sequential switching unit 310b, a sequential output unit 315b, a concurrent switching unit 320b (e.g., a simultaneous switching unit), and a concurrent output unit 325b (e.g., a simultaneous output unit).

However, in each stage as illustrated in FIG. 9, the gate of the transistor M10 is not connected to the clock terminal CK2, but is connected to the third control terminal SRT.

Accordingly, the transistor M10 is turned on/off by the third control signal SR that is received by the third control terminal SRT. That is, in the sequential switching driving of the scan driver 200a, the third control signal SR is maintained as the low voltage, and in the concurrent switching driving, the third control signal SR is maintained as the high voltage such that the operation of the scan driver 200a is controlled.

The waveform diagram for performing the sequential switching by using the circuit of each stage of FIG. 9 is shown in FIG. 10, and the waveform diagram for performing the concurrent switching is shown in FIG. 11.

The sequential switching driving and the concurrent switching driving according to the exemplary embodiment of FIG. 10 and FIG. 11 are substantially the same as shown in the driving method of FIG. 4 and FIG. 5.

However, according to the exemplary embodiment of FIG. 10, the third control signal SR is maintained as the low level, such that the third control terminal SRT receives the low voltage and the transistor M10 is turned on. Thus, the voltage of the node QC is maintained as the high voltage VGH by the transistor M10 such that the concurrent output unit 325b is not operated during the sequential switching period. In the exemplary embodiment of FIG. 3 and FIG. 4, the clock signals, transmitted to the clock terminal CK2 that is connected to the gate of the transistor M10, are refreshed during about 1H period one by one every 3H period to maintain the node QC as the high voltage. However, in the exemplary embodiment of FIG. 9 and FIG. 10, the node QC is always maintained as the high voltage by the third control signal SR such that the sequential switching driving may be more stable.

Here, according to the exemplary embodiment of FIG. 11, the third control signal SR is maintained as the high level to turn off the transistor M10 such that the concurrent switching like the driving method of FIG. 5 is executed.

Figure 12:
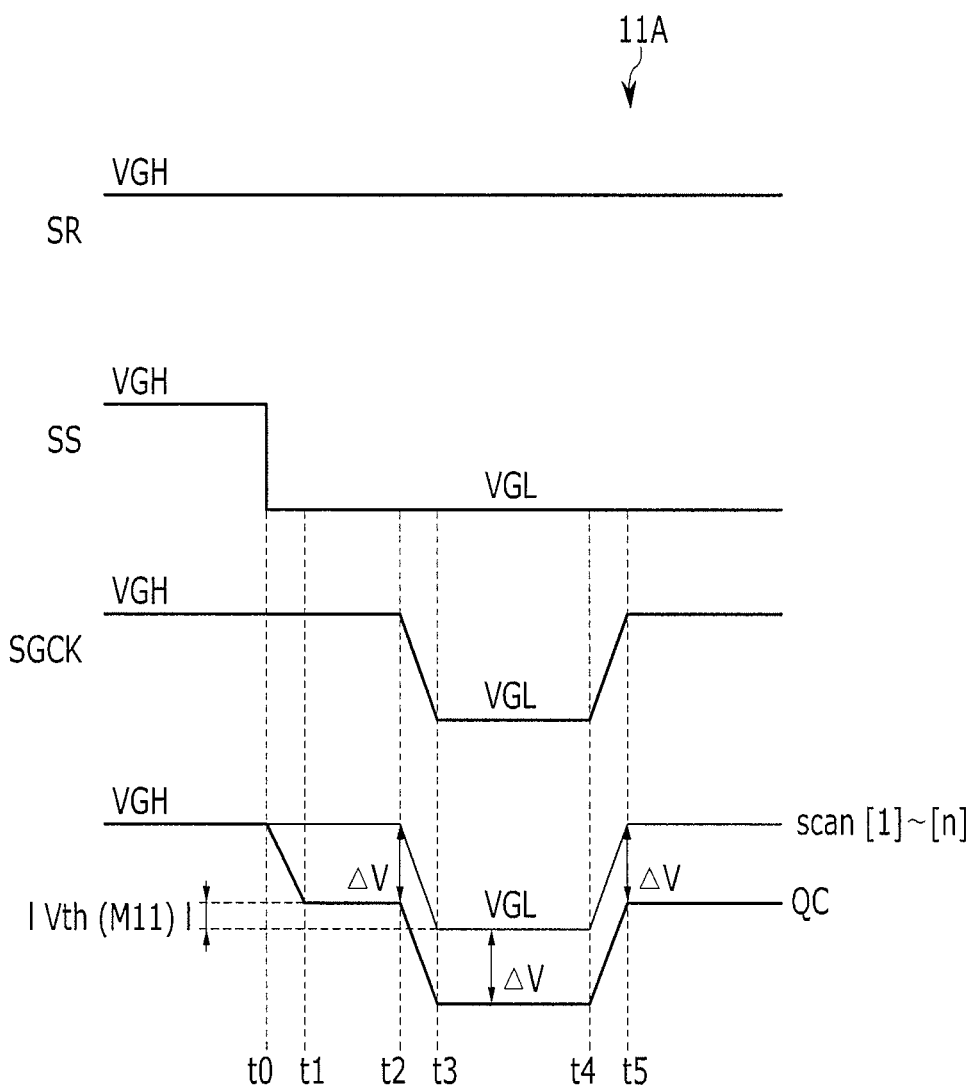

FIG. 12 is an enlarged view of a portion 11A in the signal timing diagram shown in FIG. 11, and shows a plurality of scan signals scan[1]-scan[n] that are concurrently (e.g., simultaneously) changed to the low voltage or the high voltage and are output according to the waveform of the second control signal SGCK in the stage in which the third control signal SR is maintained as the high voltage VGH during the concurrent switching period. The detailed description of the driving waveforms of FIG. 12 is substantially the same as that given for FIG. 6 such that it is omitted here.

Figure 13:
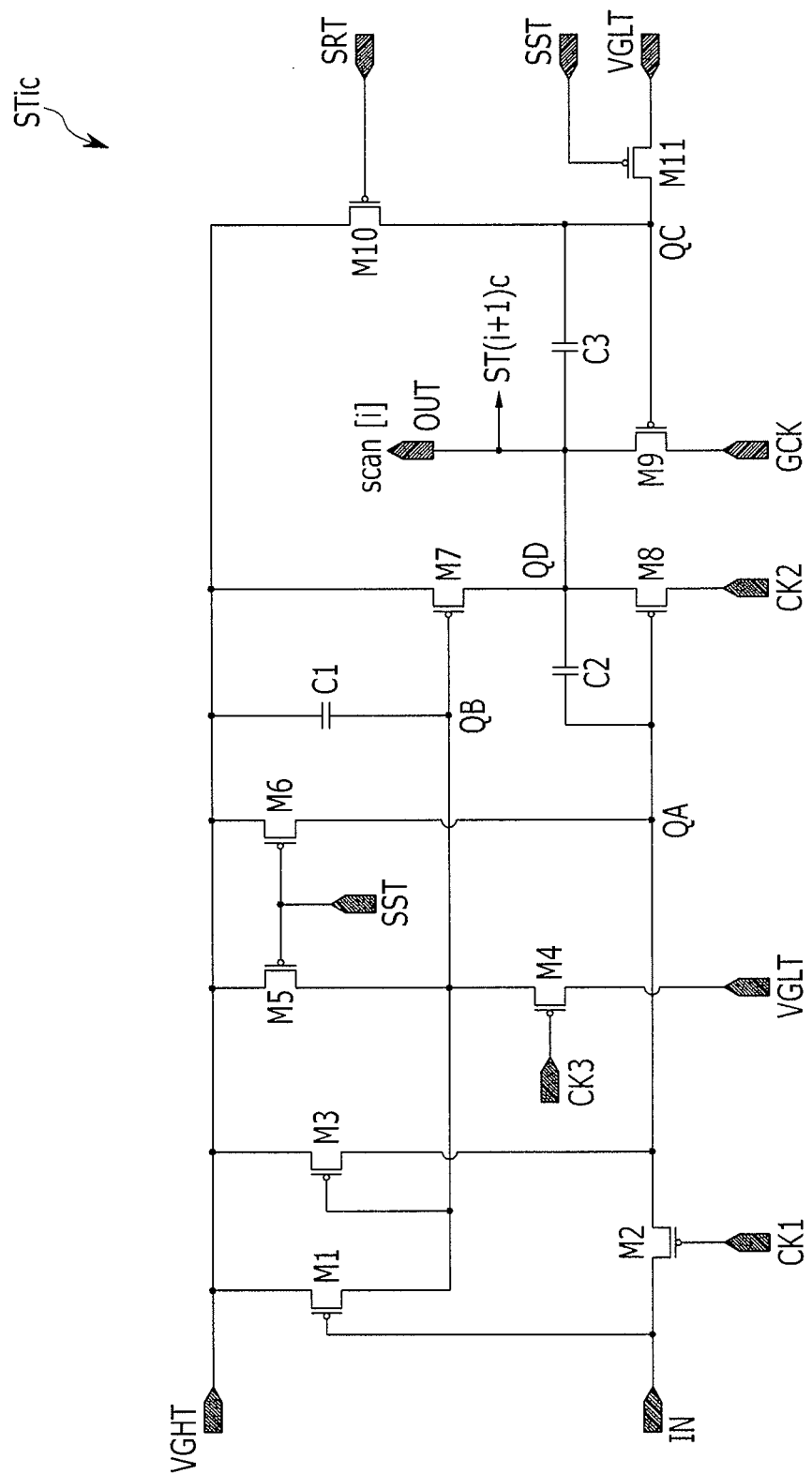
Figure 14:
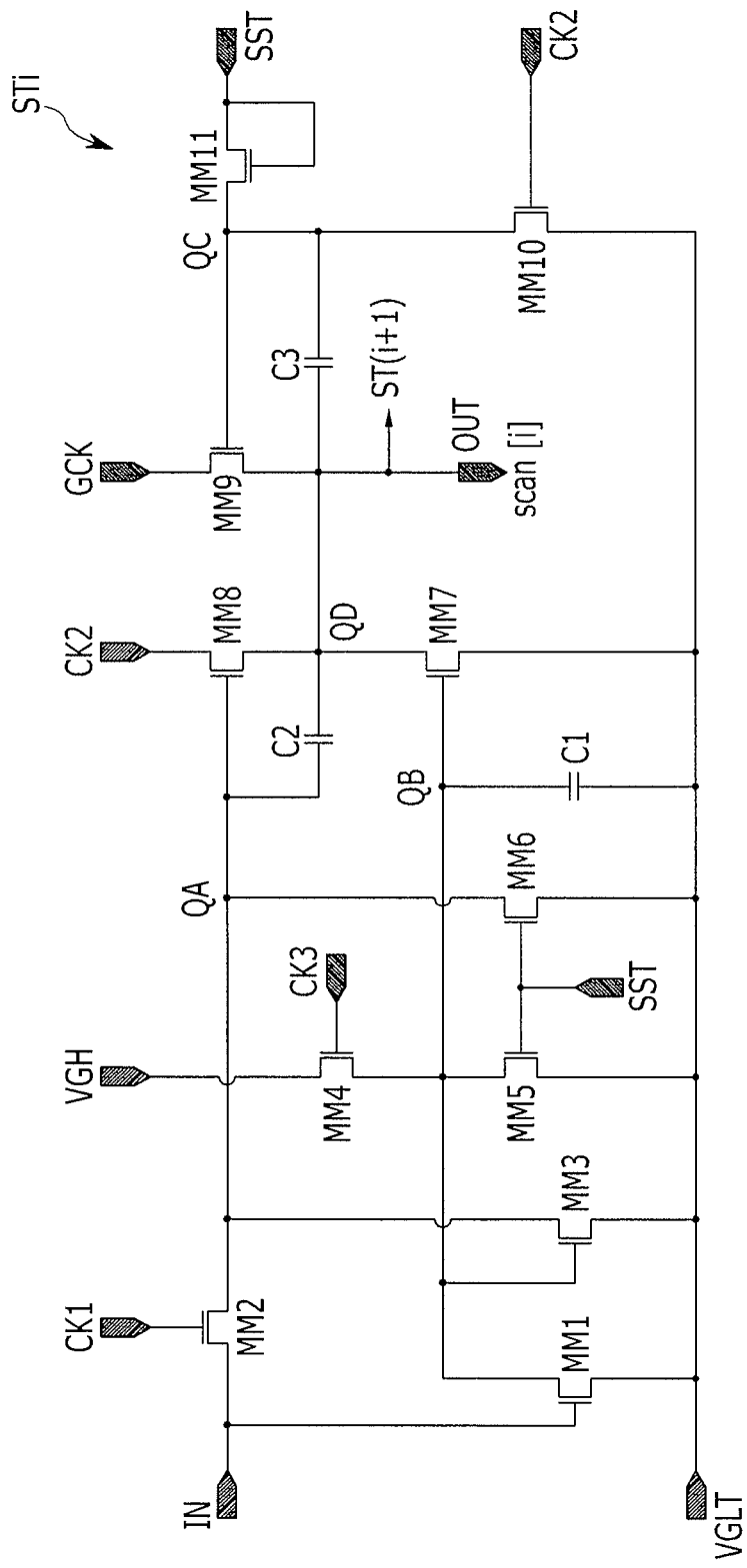
FIG. 14 to FIG. 17 are circuit diagrams realizing a transistor of one stage of FIG. 3, FIG. 7, FIG. 9, and FIG. 13 as an NMOS.
Figure 15:
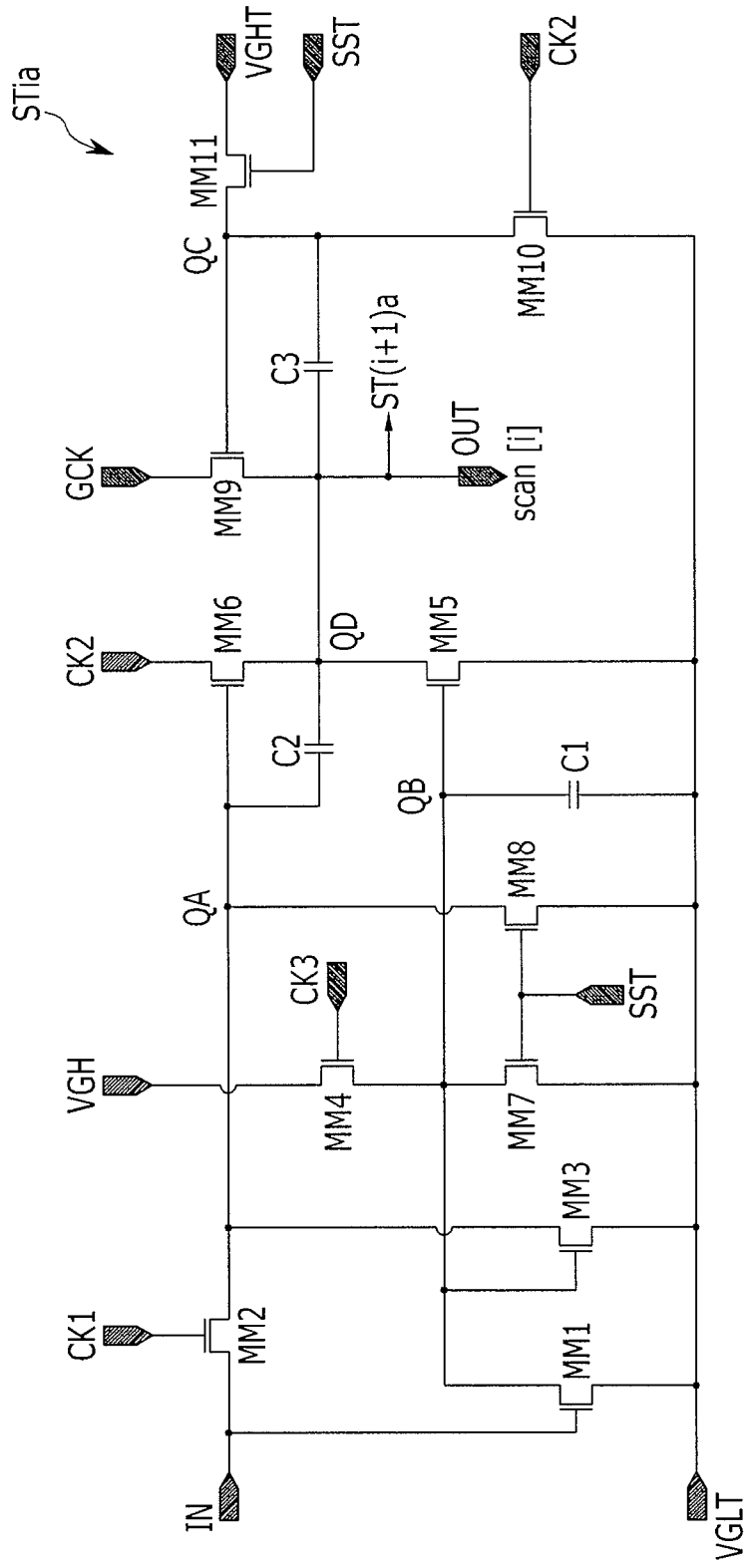
Figure 16:
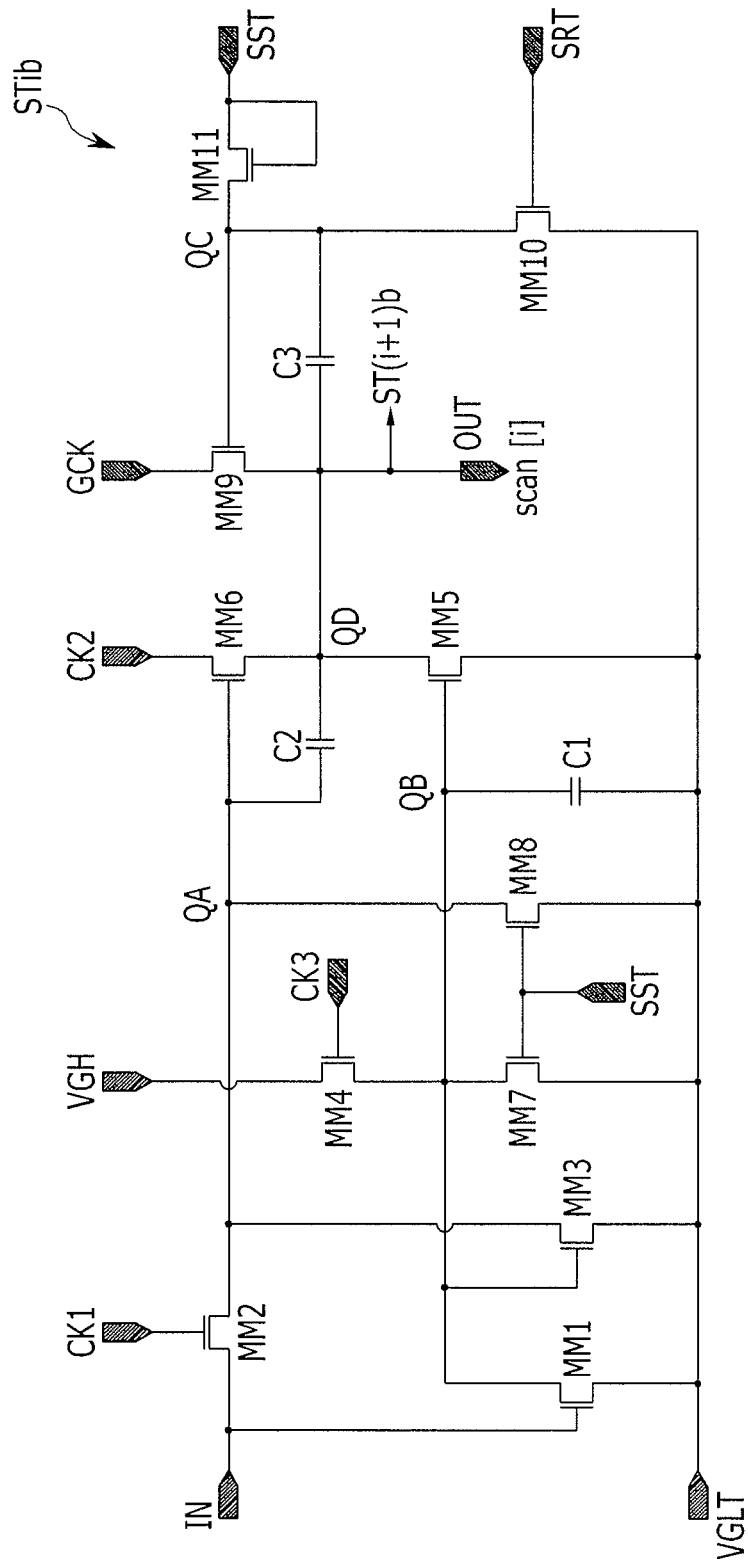
Figure 17:
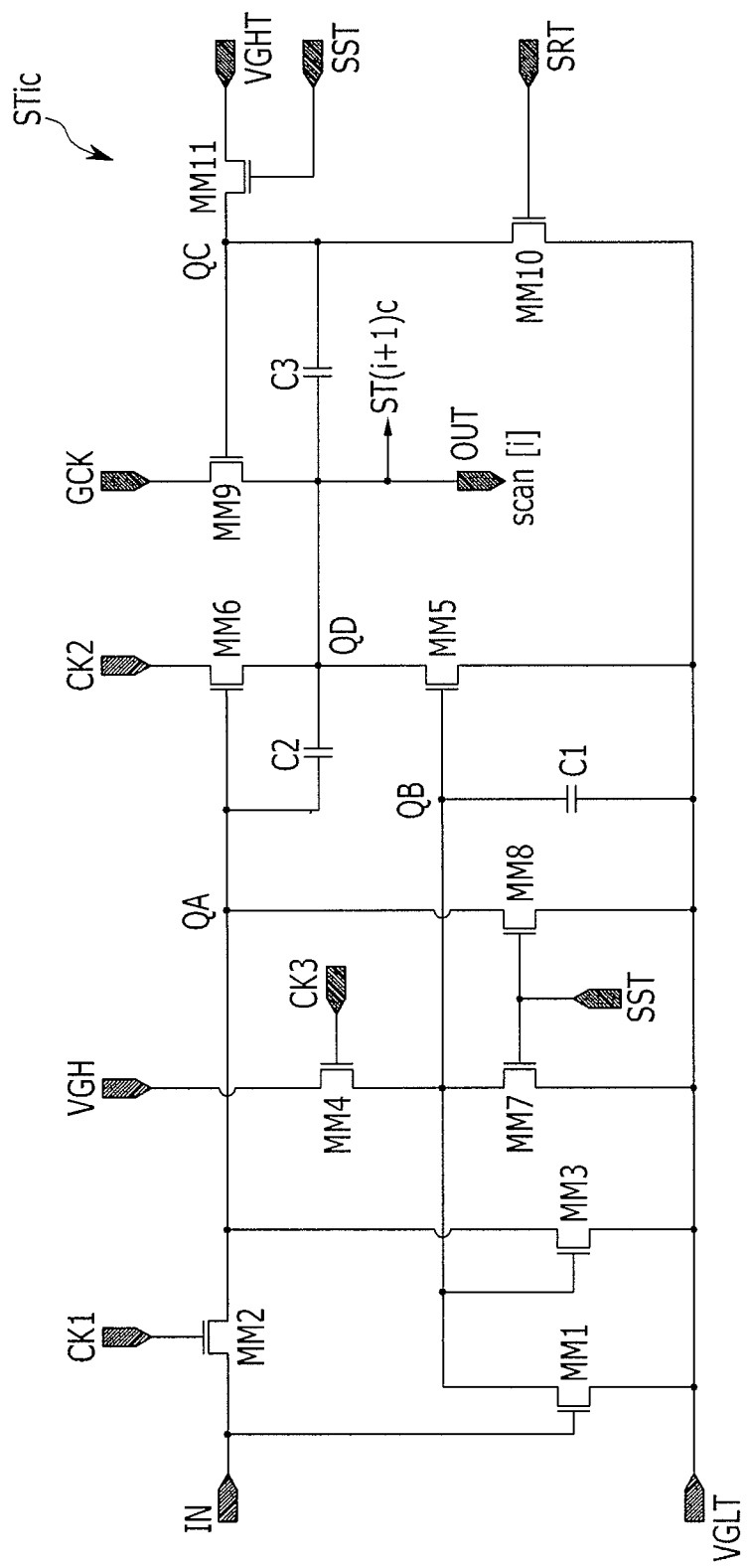

FIG. 13 is a circuit diagram of one stage STic of the scan driver 200 according to another exemplary embodiment of the present invention.

Referring to FIG. 13, the stage STic is similar to the circuit structure of the stage STib of FIG. 9, but the gate of the transistor M11 is connected to the first control terminal SST in each stage STic, and the drain of the transistor M11 is connected to the low voltage terminal VGLT. Accordingly, in the exemplary embodiment of FIG. 9, when the first control terminal SST receives the low voltage, the transistor M11 is turned on such that the voltage of the node QC becomes the low voltage. However, in the exemplary embodiment of FIG. 13, when the first control terminal SST receives the low voltage, the transistor M11 is turned on, and the low voltage VGL is applied from the low voltage terminal VGLT to which the drain of the transistor M11 is connected such that the same function is executed. The driving waveforms according to the exemplary embodiment of FIG. 13 are substantially the same as those of FIG. 9.

According to other exemplary embodiments, FIG. 14 to FIG. 17 are circuit diagrams in which the transistors shown in the exemplary embodiments of FIG. 3, FIG. 7, FIG. 9, and FIG. 13 are changed from PMOS transistors to the NMOS transistors.

The driving method of the sequential switching or the concurrent switching according to the configuration of the circuit diagrams of FIG. 14 to FIG. 17 is substantially the same as described above. However, the voltage level of the signals for operating the NMOS transistors are opposite to those for operating the PMOS transistors.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A scan driver comprising a plurality of stages being configured to transmit a scan signal to a plurality of scan lines of a display device, wherein each of the stages comprises:
    a sequential switching unit for receiving the scan signal from an output terminal of a previous stage;
    a sequential output unit connected to an output terminal of a same stage of the stages;
    a concurrent switching unit; and
    a concurrent output unit connected to the output terminal, wherein the sequential switching units of the stages are configured to sequentially scan the scan signal having a first voltage in a first period, and the sequential output units of the stages are configured to sequentially output the scan signal having the first voltage, wherein the concurrent switching units of the stages are configured to concurrently output the scan signal having a same voltage in a second period, and the concurrent output units of the stages are configured to concurrently output the scan signal having the same voltage, and wherein the concurrent output unit comprises a first transistor for transmitting a second control signal to the output terminal according to a first control signal during the second period, and a gate voltage of the first transistor is controlled by a second voltage that is different from the first voltage according to the first control signal before the scan signal is changed from a first level to a second level according to the second control signal.

2. The scan driver of claim 1, wherein the concurrent output unit further comprises:
a second transistor connected to a gate of the first transistor, and is configured to be turned on according to the first control signal to transmit a voltage of the second level.

3. The scan driver of claim 1, wherein
the first transistor is configured to output a same voltage as the first level or the second level as the scan signal during the second period corresponding to the second control signal when the first transistor is turned on.

4. The scan driver of claim 1, wherein
the second voltage is different from the voltage of the second level by a voltage difference of a third voltage.

5. The scan driver of claim 4, wherein
the third voltage is a threshold voltage of a second transistor included in the concurrent output unit of the scan driver.

6. The scan driver of claim 4, wherein
when each of the stages comprises PMOS transistors, the voltage of the second level is a low level voltage and the second voltage is higher than the low level voltage by the third voltage, and
when each of the stages comprises NMOS transistors, the voltage of the second level is a high level voltage and the second voltage is lower than the high level voltage by the third voltage.

7. The scan driver of claim 1, wherein
the first control signal has a gate-off voltage level for turning off transistors included in each of the stages at the first period and a gate-on voltage level for turning on the transistors included in each of the stages at a second period, and
the second control signal has a voltage of the first level or the second level at the second period.

8. The scan driver of claim 7, wherein
the second period comprises a third period and a fourth period, and
the concurrent switching unit and the concurrent output unit included in each of the stages are configured to concurrently output the scan signal of the same voltage as the first level corresponding to the second control signal of the first level during the third period, and to concurrently output the scan signal of the same voltage as the second level corresponding to the second control signal of the second level during the fourth period.

9. The scan driver of claim 7, wherein
each of the stages comprises first, second, and third clock terminals,
first, second, and third clock signals are alternately and respectively input to the first, second, and third clock terminals of each of the stages, and
the first, second, and third clock signals sequentially have gate-on voltage levels for turning on the transistors included in each of the stages during the first period, and each have a cycle of 3 horizontal cycles and a 1/3 duty ratio.

10. The scan driver of claim 9, wherein
the sequential switching unit and the sequential output unit of each of the stages are configured to sequentially scan the scan signal corresponding to the first, second, and third clock signals during the first period, and
the sequential output unit is configured to output a voltage of the second clock terminal as the first voltage of the scan signal during the first period.

11. The scan driver of claim 9, wherein
each of the stages further comprises a control terminal,
a third control signal is input to the control terminal, and
the third control signal has a gate-on voltage level for turning on the transistors included in each of the stages during the first period.

12. The scan driver of claim 7, wherein
each of the stages comprises first, second, and third clock terminals,
first, second, and third clock signals are alternately and respectively input to the first, second, and third clock terminals of each of the stages, and
the first, second, and third clock signals all have the gate-off voltage level for turning off the transistors included in each of the stages during the second period.

13. The scan driver of claim 12, wherein
each of the stages further comprises a control terminal,
a third control signal is input to the control terminal, and
the third control signal has the gate-off voltage level for turning off the transistors included in each of the stages during the second period.

14. A scan driver comprising a plurality of stages being configured to transmit a scan signal to a plurality of scan lines of a display device,
wherein each of the stages comprises:
a first transistor connected between a first control terminal supplied with a voltage of a first level or a second level and an output terminal for outputting a scan signal having a voltage according to the voltage of the first control terminal, the first transistor having a gate connected to a first node;
a second transistor connected between a second control terminal supplied with the voltage of the first level or the second level and the first node, the second transistor having a gate connected to the second control terminal;
a third transistor connected to a first voltage terminal supplied with a first voltage and the output terminal, the third transistor having a gate connected to a second node;
a fourth transistor connected between the output terminal and a clock terminal supplied with the voltage of the first level or the second level, the fourth transistor having a gate connected to a third node;
a sequential driver connected to an input terminal for receiving a scan signal from a previous stage, the first voltage terminal, a second voltage terminal for supplying the second voltage, and the first node to the third node, the sequential driver being configured to operate the third and fourth transistors to sequentially output the scan signal having the second voltage to the output terminal of the plurality of stages during a first period; and
a concurrent driver connected to the first voltage terminal, the second control terminal, the second node, and the third node, the concurrent driver being configured to concurrently turn on the first and second transistors such that the scan signal of a same voltage is concurrently output to the output terminals of the plurality of stages during a second period,
wherein before the scan signal of the same voltage is changed from a first level to a second level according to the voltage of the first control terminal, each of the stages is configured to control a voltage of the first node to be a third voltage that is different from the second voltage.

15. The scan driver of claim 14, wherein
the third voltage is different from the voltage of the second level by a fourth voltage.

16. The scan driver of claim 15, wherein
the fourth voltage is a threshold voltage of the second transistor.

17. The scan driver of claim 15, wherein
when each of the stages comprises PMOS transistors, the voltage of the second level is a low level voltage and the third voltage is higher than the low level voltage by the fourth voltage, and
when each of the stages comprises NMOS transistors, the voltage of the second level is a high level voltage and the third voltage is lower than the high level voltage by the fourth voltage.

18. The scan driver of claim 14, wherein
the second transistor is connected between the second voltage terminal for receiving a fifth voltage and the first node, and the gate of the second transistor is connected to the second control terminal for receiving the voltage of the first level or the second level.

19. The scan driver of claim 14, wherein
each of the stages is configured to receive a first control signal and a second control signal,
the first control signal has a gate-off voltage level for turning off the transistors included in each of the stages during the first period and a gate-on voltage level for turning on the transistors included in each of the stages during the second period, and
the second control signal has a voltage of the first level or the second level during the second period.

20. The scan driver of claim 19, wherein
the second period includes a third period and a fourth period, and
the concurrent drivers of the stages are configured to concurrently output the scan signal as the first level corresponding to the second control signal of the first level during the third period and to concurrently output the scan signal as the second level corresponding to the second control signal of the second level during the fourth period.

21. The scan driver of claim 14, wherein
the concurrent driver comprises
a fifth transistor connected between the first voltage terminal and the second node, the fifth transistor being configured to be turned on in response to a gate-on voltage supplied to the second control terminal, and
a sixth transistor connected between the first voltage terminal and the third node, the sixth transistor being configured to be turned on in response to the gate-on voltage supplied to the second control terminal.

22. The scan driver of claim 14, wherein
each of the stages further comprises a first capacitor connected between the output terminal and the first node.

23. The scan driver of claim 14, wherein
the sequential driver comprises:
a seventh transistor connected between the first voltage terminal and the second node, the seventh transistor having a gate connected to the input terminal;
an eighth transistor connected between the first voltage terminal and the third node, the eighth transistor having a gate connected to the second node;
a ninth transistor connected between the input terminal and the third node, the ninth transistor having a gate connected to a first clock terminal;
a tenth transistor connected between the first voltage terminal and the first node, the tenth transistor having a gate connected to a second clock terminal or a third control terminal; and
an eleventh transistor connected between the second node and the second voltage terminal, the eleventh transistor having a gate connected to a third clock terminal.

24. The scan driver of claim 23, wherein
first, second, and third clock signals are alternately and respectively input to the first, second, and third clock terminals,
the first, second, and third clock signals sequentially have a gate-on voltage level for turning on a transistor during the first period, and each have three horizontal cycles and a 1/3 duty ratio, and
the first, second, and third clock signals have a gate-off voltage level for turning off the transistor during the second period.

25. The scan driver of claim 23, wherein
first, second, and third clock signals are alternately and respectively input to the first, second, and third clock terminals, and a third control signal is input to the third control terminal,
the signal input to the second clock terminal or the third control terminal has a gate-on voltage level for turning on a transistor during the first period, and
the signal input to the second clock terminal or the third control terminal has a gate-off voltage level for turning off the transistor during the second period.

26. The scan driver of claim 14, wherein
each of the stages further comprises a second capacitor connected between the first voltage terminal and the second node, and a third capacitor connected between the output terminal and the third node.

27. A method for driving a scan driver of a display device comprising a plurality of scan lines, the method comprising:
in sequential driving, in response to a plurality of clock signals each alternately having a first level and a second level, sequentially transmitting a scan signal having a voltage corresponding to the second level to the plurality of scan lines; and
in concurrent driving, concurrently applying the scan signal having the voltage corresponding to the first level or the second level to the plurality of scan lines according to a second control signal having the voltage corresponding to the first level or the second level, in a state in which the plurality of clock signals are maintained as the first level and a first control signal is maintained as the second level,
wherein in the concurrent driving, before the scan signal is changed from the first level to the second level according to the second control signal, a gate voltage of a first transistor for transmitting the second control signal to an output terminal according to the first control signal is controlled at a first voltage that is different from the voltage corresponding to the second level.

28. The method of claim 27, wherein
the first voltage is different from the voltage corresponding to the second level by a second voltage.

29. The method of claim 28, wherein
the second voltage is a threshold voltage of a second transistor connected to a gate of the first transistor.

30. The method of claim 28, wherein
when the scan driver comprises PMOS transistors, the voltage corresponding to the second level is a low level voltage and the first voltage is higher than the low level voltage by the second voltage, and when the scan driver comprises NMOS transistors, the voltage corresponding to the second level is a high level voltage and the first voltage is lower than the high level voltage by the second voltage.

31. The method of claim 27, wherein in the sequential driving, further comprising receiving a third control signal having the second level, and in the concurrent driving, further comprising receiving the third control signal having the first level.

\* \* \* \* \*